United States Patent [19]
Carey et al.

[11] Patent Number: 5,438,166
[45] Date of Patent: * Aug. 1, 1995

[54] CUSTOMIZABLE CIRCUITRY

[75] Inventors: David H. Carey, Austin, Tex.; Barry H. Whalen, Los Alto, Calif.

[73] Assignee: Microelectronics and Computer Technology Corporation, Austin, Tex.

[*] Notice: The portion of the term of this patent subsequent to Jul. 21, 2009 has been disclaimed.

[21] Appl. No.: 979,541

[22] Filed: Nov. 23, 1992

Related U.S. Application Data

[63] Continuation of Ser. No. 739,344, Sep. 9, 1991, Pat. No. 5,165,166, which is a continuation of Ser. No. 344,534, Apr. 25, 1989, Pat. No. 5,132,878, which is a continuation of Ser. No. 102,172, Sep. 29, 1987, abandoned.

[51] Int. Cl.$^6$ .............................................. H05K 1/02
[52] U.S. Cl. .................... 174/261; 174/255; 361/777; 361/794; 361/795; 361/805; 439/48
[58] Field of Search ............... 174/254, 255, 261, 262, 174/259, 250; 361/749, 777, 778, 792, 794, 795, 805; 439/77, 48

[56] References Cited

U.S. PATENT DOCUMENTS

| | | | |
|---|---|---|---|
| 2,019,625 | 11/1935 | O'Brien | 361/805 |
| 2,914,706 | 11/1959 | Hill et al. | 361/778 |
| 3,028,573 | 4/1962 | Stoehr | 439/48 |
| 3,128,332 | 4/1964 | Burkig et al. | 174/254 |
| 3,142,112 | 7/1964 | Burkig et al. | 29/847 |
| 3,148,438 | 9/1964 | Winter et al. | 29/837 |
| 3,378,920 | 4/1968 | Cone | 29/847 |
| 3,478,425 | 11/1969 | Cooke | 29/868 |
| 3,485,934 | 12/1969 | Prather | 174/254 |
| 3,499,098 | 3/1970 | McGahey et al. | 174/261 |
| 3,525,617 | 8/1970 | Bingham | 430/312 |
| 3,535,780 | 10/1970 | Berger | 29/837 |
| 3,564,115 | 2/1971 | Gribble et al. | 174/254 |
| 3,621,116 | 11/1971 | Adams | 174/254 |
| 3,683,105 | 9/1972 | Shamash et al. | 257/668 |
| 3,702,025 | 11/1972 | Archer | 437/8 |

(List continued on next page.)

FOREIGN PATENT DOCUMENTS

| | | |
|---|---|---|
| 0016522 | 1/1980 | European Pat. Off. . |
| 0074303 | 3/1983 | European Pat. Off. . |
| 0167732 | 1/1986 | European Pat. Off. . |
| 0214628 | 9/1986 | European Pat. Off. . |

(List continued on next page.)

OTHER PUBLICATIONS

Ho et al., "The Thin-Film Module as a High Performance Semiconductor Package," *IBM J. Res. Develop.*, vol. 26, 3:286–296 (May 1982).

Ho et al., "Transmission Line Analysis and Design Process," *Defensive Publication*, United States Patent (List continued on next page.)

*Primary Examiner*—Leo P. Picard
*Assistant Examiner*—L. Thomas
*Attorney, Agent, or Firm*—Arnold, White & Durkee

[57] ABSTRACT

A customizable circuit using a programmable interconnect and compatible TAB chip bonding design. The programmable interconnect comprises layers of wire segments forming programmable junctions rather than continuous wires. This segmentation is performed with an offset from line to line in each layer such that the ends of the segments in each layer form long diagonal lines having a pitch determined by the basic wire segment length. Uniform capacitance effects are achieved by alternating the layers of the wire segments. The terminal ends of the segments are positioned in a plane such that segments may be connected by short links to form the desired interconnect. The links which join the line segments customize the otherwise undedicated interconnect. Resistive links may be used to minimize undesirable transmission line effects. The segment ends may also be connected through electrically programmable elements. Carrier tape bonds the integrated circuit chips to the programmable interconnect. Also disclosed are methods for forming the interconnect and the TAB chip bonding design.

12 Claims, 16 Drawing Sheets

U.S. PATENT DOCUMENTS

| | | | |
|---|---|---|---|
| 3,711,627 | 1/1973 | Maringulov | 174/253 |
| 3,718,936 | 2/1973 | Rice, Jr. | 346/153 |
| 3,777,221 | 12/1973 | Tatsuko et al. | 361/761 |
| 3,824,433 | 7/1974 | Newton, Jr. | 361/805 |
| 3,838,317 | 9/1974 | Coyne | 439/49 |
| 3,909,680 | 9/1975 | Tsunashima | 361/766 X |
| 4,210,885 | 7/1980 | Ho | 333/238 |
| 4,254,445 | 3/1981 | Ho | 361/728 |
| 4,426,548 | 1/1984 | Oritsuki et al. | 174/72 R |
| 4,434,321 | 2/1984 | Betts . | |
| 4,438,560 | 3/1984 | Kisters | 29/830 |
| 4,443,278 | 4/1984 | Zingher | 162/101 |
| 4,458,297 | 7/1984 | Stopper et al. . | |
| 4,467,400 | 8/1984 | Stopper | 361/767 |
| 4,486,705 | 12/1984 | Stopper | 324/73.1 |
| 4,489,364 | 12/1984 | Chance et al. | 361/777 |
| 4,495,377 | 1/1985 | Johnson et al. | 174/268 |
| 4,495,479 | 1/1985 | Hermann | 333/238 |
| 4,521,262 | 6/1985 | Pellegrino | 156/130 |
| 4,524,239 | 6/1985 | Rouge | 174/254 |
| 4,605,872 | 8/1986 | Rung | 307/465 |
| 4,636,919 | 1/1987 | Itakura et al. | 361/794 |
| 4,642,487 | 2/1987 | Carter | 307/465 |
| 4,652,974 | 3/1987 | Ryan | 361/739 |
| 4,675,989 | 6/1987 | Gallaway et al. | 29/847 |
| 4,720,915 | 1/1988 | Kennedy et al. | 29/847 |
| 4,744,007 | 5/1988 | Watari et al. | 361/718 |
| 4,750,089 | 6/1988 | Derryberry et al. | 361/712 |
| 4,758,745 | 7/1988 | Elgamal et al. | 307/465 |
| 4,764,644 | 8/1988 | Reisman et al. | 29/847 X |
| 4,823,181 | 4/1989 | Mohsen et al. | 357/51 |
| 4,855,619 | 8/1989 | Hsieh et al. | 307/443 |
| 4,857,774 | 8/1989 | El-Ayat et al. | 307/465 |
| 4,870,302 | 9/1989 | Freeman | 307/465 |
| 4,876,220 | 10/1989 | Mohsen et al. | 437/107 |
| 4,881,114 | 11/1989 | Mohsen et al. . | |
| 4,899,205 | 2/1990 | Hamdy et al. | 357/51 |
| 4,899,439 | 2/1990 | Potter | 29/846 |
| 4,907,127 | 3/1990 | Lee | 29/847 X |
| 5,023,751 | 6/1991 | Stampfli | 29/847 X |
| 5,060,116 | 10/1991 | Grobman | 29/847 X |
| 5,101,323 | 3/1992 | Prerost | 361/394 |
| 5,132,878 | 7/1992 | Carey | 361/410 |

FOREIGN PATENT DOCUMENTS

| | | |
|---|---|---|
| 2382101 | 9/1978 | France . |
| 2557755 | 5/1985 | France . |
| 2929050 | 2/1980 | Germany . |

OTHER PUBLICATIONS and Trademark Office, T940,015 (Nov. 4, 1975).

Bursky, "On-Chip Ram and Hierachical Routing Improve Programmable-Flexibility," *Electronic Design*, 35-36 (Jul. 12, 1990).

IBM Technical Disclosure Bulletin vol. 13, No. 12, May 1971, p. 3653; E. G. Kutch: "Edge definition as related to angled electrode lands".

IBM Technical Disclosure Bulletin vol. 14, No. 4, Sep. 1971, pp. 1316, 1317; E. C. Layden: "Use of relatively diagonal and rectangular wiring planes in multilayer packages".

Flexmark Brochure—"How to Cut Your Flex Generation Lead Time from Weeks to Minutes!".

CUSTOMIZABLE CIRCUITRY

This is a continuing application of application Ser. No. 07/739 filed on Sep. 9, 1991, now U.S. Pat. No. 5,165,166 which in turn is a continuing application of application Ser. No. 07/344,534 filed Apr. 25, 1989, now U.S. Pat. No. 5,132,878, which in turn is a continuing application of application Ser. No. 07/102,172, filed Sep. 29, 1987, now abandoned. This application expressly incorporates herein by reference each of these prior applications.

BACKGROUND OF THE INVENTION

The present invention relates to customizable circuitry, and particularly to customizable circuitry which includes an interconnect for receiving and electrically connecting electrical devices and tape automated bonding chip designs. The invention relates to an interconnect which can be produced in gross with an undedicated, universal structure and subsequently customized to a specific application with minimal effort and fabrication, and to a tape automated bonding chip design for use therewith. Further, the invention also concerns a method for manufacturing the interconnect and chip design.

Customizable circuitry, as used herein, refers to that circuitry in which some of the device interconnections are not made during the initial manufacture of the circuitry, but are deferred. This deferral allows the circuitry to be manufactured in large quantities with generic properties, with the specific design details being applied later by the user in a final step called "customization." Integral to customizable circuitry is a generic interconnect structure coupled with a method of bonding the leads of integrated circuit chips to that interconnect structure.

Interconnects, as building blocks for electronic circuitry and microcircuitry, typically receive and support further electrical devices, for example, substrates, i.e., smaller scale interconnects, integrated chips, capacitors, resistors and so forth, which can be electrically connected to one another to provide larger, more complex electrical structures. The interconnects typically have a sandwich-type structure through which a series of wires extend. The wires connect the electrical devices attached to the interconnect according to a plan specified by the interconnect user.

The interconnects are used in a multiplicity of designs, each requiring unique electrical circuitry. Presently, in a majority of the interconnects, the wiring plan is fixed at an early stage of manufacture. In other words, the manufacturer lays down the interconnect wiring according to a specific, predetermined plan. Such interconnects will be referred to as "design specific." As is readily apparent, design specific interconnects cannot be mass produced and are, therefore, time and cost intensive.

Recognizing the shortcomings of design-specific interconnects, there arose a need in the interconnect industry for an interconnect design which could be mass-produced in an unspecified manner and thereafter programmed to produce whatever wiring plan is required by the user. Such interconnects will be referred to as "programmable interconnects" and the final step of imposing the wiring plan on the interconnect will be referred to as "customization."

It is desirable, though, to retain some of the benefits of design-specific interconnects. For example, design-specific interconnects can be designed to minimize transmission line signal reflection or ringing effects. Interconnect transmission line effects are becoming increasingly important as integrated chip performance improves. Traditionally, large discrete series or shunt resistors have been added to interconnects in order to address undesirable signal reflection or ringing effects. However, adding discrete resistors increases manufacturing complexity and costs while consuming more circuit space. Therefore, alternative methods to address deleterious transmission line effects are desirable.

As disclosed in U.S. Pat. No. 4,210,885 to Ho, judiciously selecting the resistance value for each interconnect route relative to the characteristic impedance of the associated transmission line will minimize reflection or ringing problems. The Ho circuit adjusts the resistance without adding discrete resistors by distributing the resistance into the interconnect route itself. A specific resistance may be achieved by varying interconnect wire geometries and the characteristic resistance of the interconnect material. It is desirable that the resistance in the interconnect route be large enough to substantially reduce the signal reflection or ringing, yet at the same time not be so large as to severely attenuate the signal. For high frequency signals, a satisfactory reduction in signal reflection has been found when interconnect route resistance, $R_I$, is within a general range of $\frac{2}{3} Z_0 \leq R_I \geq 2 Z_0$, where $Z_0$ is the characteristic impedance of the transmission line seen by the signal source.

A previous attempt at programmable interconnect design is disclosed in U.S. Pat. No. 4,458,297 to Mosaic Systems, Inc. The Mosaic design provides interconnect wiring in the form of a grid with wires in one direction forming one plane and orthogonal wires forming a second plane. Positioned between the two sets of wires is a layer of amorphous silicon which, though originally non-conductive, can be rendered conductive at specified points of wire overlap. The selective conductivity is achieved through crystallization of the amorphous silicon by applying a voltage differential across the orthogonal wires. The electric field produced by this voltage differential causes the silicon in the region of the overlapped wires to crystallize and become conductive. Therefore, an electrical path is formed between the overlapped wires.

The Mosaic structure is advantageous in that it provides for the mass production of undedicated interconnects which can be customized by the manufacturer or by the end user at a later stage of manufacture. The Mosaic interconnect, however, has many drawbacks. For example, because of the electrical properties required, a limited number of materials can be used. Amorphous silicon is the only suggested material for use as the intermediate layer. Also, while a limited number of metals might be used for the interconnect wiring, aluminum is by far the best candidate because its properties are compatible with the amorphous silicon. The density of the Mosaic grid, and specifically the proximity of the wires in the overlap region, is limited since a sufficiently large area about the overlap region is required to avoid shorting of adjacent wires during crystallization. In other words, the electric field forms an area of flux between the overlapped wires extending into the area between adjacent overlap regions. If the wires are placed too close together, this region of flux may cause adjacent regions to bleed together and short the adjacent wires.

Another disadvantage of the Mosaic design is that it is only an additive process. In other words, the wire routing is formed by adding electrically conductive segments, i.e., the crystalline silicon bridges. The design is not subtractive. Accordingly, it is very difficult, if not impossible, to make changes to the customized interconnect. The difficulty in altering the customized wiring makes engineering changes impractical. A further and very crucial disadvantage in the Mosaic design results from the fact that each additive step, i.e., creation of the silicon bridge, excludes both affected orthogonal wires from further utilization in the interconnect plan, except as to this one route. In other words, if X1 and Y1 wires are bridged to provide an interconnect path, these wires, or segments thereof, cannot be used to provide another interconnect path, for to do so would result in a shorting of the two paths together. This characteristic of the Mosaic interconnect severely limits the complexity of the interconnect for a given interconnect area. This complexity limit affects the interconnect efficiency for the available channels, called channel utilization. It is desirable to have high channel utilization since a given interconnect can be performed with fewer channels if high channel utilization is present.

Furthermore, the Mosaic design does not address transmission line ringing or reflection. In general, line resistance matching methods such as disclosed by Ho have not been available in programmable designs because final interconnect wire lengths design are not known until after customization.

Other electrically programmable interconnect designs are known to those skilled in the art. For example, capacitor like structures may be used as a programmable element for connecting interconnect lines by utilizing the dielectric breakdown properties of the structures. The capacitor like structure can be formed between interconnect lines such that the structure has low leakage current in an unprogrammed state. The structure has a dielectric layer between two conductive layers and after applying a high electric field to the structure the dielectric material electrically breaks down and a conductive path between the interconnect lines is created. Such a structure is sometimes called an anti-fuse because unlike a typical electrical fuse, which is originally conductive then electrically blown, an anti-fuse is normally nonconductive then electrically switched to a conductive state. Such capacitor like structures are disclosed in U.S. Pat. No. 4,899,205 to Hamdy et al. and U.S. Pat. No. 4,823,181 to Mohsen, the disclosure of these two patents is expressly incorporated herein by reference. Various electric circuits can be used to electrically address and incorporate such anti-fuse programmable elements. These circuits include those disclosed in U.S. Pat. No. 4,857,774 to El-Ayat et al. and U.S. Pat. No. 4,758,745 to Elgamal et al., the disclosure of these two patents is expressly incorporated herein by reference.

Additional methods for using electrically programmable elements in interconnects exists including, but not limited to, pass transistors, diode arrangements and standard fuse arrangements. For example, transistors may be placed between the interconnect lines. In order to electrically connect or disconnect two lines, a pass transistor connecting the lines is turned on or off. U.S. Pat. No. 4,870,302 to Freeman, U.S. Pat. No. 4,855,619 to Hsieh et al., and U.S. Pat. No. 4,642,487 to Carter disclose the use of transistors to connect interconnect lines, the disclosure of these three patents is expressly incorporated herein by reference. The use of diodes as programmable elements is also known and is disclosed in U.S. Pat. No. 4,876,220 to Hamdy et al., the disclosure of which is expressly incorporated herein by reference.

The various electrical programmable elements described above, however, do not incorporate the use of full universal customizable circuits, but rather are used in design specific interconnects. It is desirable to incorporate electrical programming capabilities in a generic universal customizable circuit.

In addition to electrical customization approaches, mechanical customization has also been used in some areas. For example, "Wire-Wrap" involves the use of an interconnect having a number of metal pins extending orthogonally from the interconnect surface. After the wiring plan has been specified, the appropriate pins can be connected by wrapping wires about the appropriate pins. Because of the forces involved, large, rigid pins are needed along with large tools to wrap the wire securely. The process is time consuming, since only one wire is added at a time, and cannot be used for small scale circuits such as integrated circuits because of the large pins and tools required.

Another mechanical customization approach is the use of wire bonding to interconnect bonding pads provided on the surface of an integrated circuit. The interconnect is provided by welding or sputtering a thin wire onto a metal bonding pad at each end of the desired interconnect path. This approach has many disadvantages, however, including very poor area efficiency. For example, the sputtering used requires the use of large bonding pads with large spaces between them to assure that the sputtering process does not destroy the pad or cause a short circuit. Further, because the interconnect wires are not insulated, the density is restricted to those interconnect paths that do not require crossed wires. Thus, this procedure has most of the disadvantages of wire wrap with the additional disadvantage that interconnect paths cannot cross each other. In addition, both wire-wrap and bond pad methods fail to provide simple means to minimize undesirable transmission line effects without using additional components and adding to the interconnect complexity.

Turning now to the problems of mounting the integrated circuit chips, it is conventional practice to mount such chips on interconnect structures which serve to electrically connect the chips. The integrated circuit chips are frequently mounted on carrier film, or tape, by a process known as "Tape Automated Bonding" (TAB). To achieve efficiency in the resulting customizable circuit, it is important to match the chip bonding technique used to the particular interconnect structure.

Accordingly, there exists a need in the art for an improved customizable circuitry including a programmable interconnect which can be mass produced to include an unspecified wiring plan and which can be subsequently specified in the later stages of manufacture or by the end-user with a minimum of effort and time, and which can provide a dense interconnect structure which can be practiced at both the printed circuit and integrated circuit levels, and a tape automated bonding structure compatible with such interconnects. Furthermore, there exists a need in the art for an improved customizable circuitry that also substantially reduces undesirable transmission line effects without increasing

SUMMARY OF THE INVENTION

The problems outlined above are in a large part solved by the device and methods of the present invention. That is, the apparatus and method provide improved customizable circuitry. Additionally, an interconnect for customizable circuitry is provided which can be produced as an undedicated interconnect and then customized based on user needs. Further the invention for customizable circuitry can substantially reduce undesirable transmission line effects in a simple manner.

In accordance with one aspect of the present invention, there is provided an interconnect for connecting electrical components, comprising a first set of essentially parallel wire segments, a second set of essentially parallel wire segments non-planar and non-parallel to the first set of wire segments, a plurality of accessible programmable junctions formed from the terminal ends of intersecting wire segments, the plurality of programmable junctions forming a plurality of diagonally extending programming tracks, and means for selectively linking the wire segments at the programmable junctions. In a preferred embodiment the interconnect further comprises a customization layer above the first and second sets of wire segments, the customization layer comprises regions for accessing the programmable junctions. The access areas in the customization layer may be continuous across the layer or may be in the form of apertures therethrough.

In accordance with another aspect of the present invention, there is provided a programmable electrical interconnect for connecting electrical components including a set of X conductors and Y conductors both sets comprising a plurality of substantially parallel electrically conductive segments of substantially uniform length arranged end-to-end. The interconnect also includes a plurality of programmable junctions formed in a regular pattern, each junction including segment ends of two X-conductor segments and two Y-conductor segments, the segment ends in each programmable junction being positioned such that electrical connections can be accomplished between all combinations of segment ends forming the programmable junction.

The invention further contemplates the X- and Y-conductor sets being positioned so that segments of the X- and Y-conductors overlap. The invention also contemplates an interconnect layer including the programmable junction, a majority of the X-segments and Y-segments extending to the interconnect layer to form the programmable junction. The X-conductor segments may also be formed in first and second conductor layers and the Y-conductor segments may also be formed in the first and second conductor layers. The invention further contemplates an interconnect in which the two X-conductor segments terminating at each programmable junction are formed in separate substantially parallel planar layers, a first conductor and second conductor layer, and the two Y-conductor segments terminating at each programmable junction are formed in separate substantially parallel planar layers, the first conductor layer and the second conductor layer. Also contemplated are end-to-end adjacent X-conductor segments alternating between a first conductor layer and a second conductor layer, the first and second conductor layers lying in separate planes and end-to-end adjacent Y-conductor segments alternating between the first conductor layer and the second conductor layer.

In still another aspect of the present invention, a resistive link, capable of accomplishing the selective connections of the segment ends, is selectively connected to at least one segment. The link has a resistance sufficient to significantly reduce signal reflection of the electrical signals carried by the interconnect. Further, the invention contemplates a plurality of resistive links, capable of accomplishing the selective electrical connections of the segment ends, the links having a combined distributed resistance sufficient to significantly reduce signal reflection of electrical signals carried by the interconnect. Also contemplated is at least one conductive plane connection within the programming junctions and at least one resistive link selectively connecting segment ends to the conductive plane so that the resistance of the link significantly reduces signal reflection of electrical signals carried by the interconnect.

In accordance with yet another aspect of the present invention, there is provided a programmable electrical interconnect for connecting components comprising a plurality of programmable junctions, each programmable junction including a plurality of wire segments. Resistive links are selectively connected to the wire segment ends within the programming junction, the links having a resistance selected to significantly reduce signal reflections of electrical signals carried in the interconnect.

In accordance with yet another aspect of the present invention, there is provided a method for forming an interconnect for receiving and electrically connecting electrical components, comprising the steps of preparing a programmable interconnect for connecting electrical components, comprising a first set of essentially parallel wire segments, a second set of essentially parallel wire segments non-planar and non-parallel to the first set of wire segments, a plurality of accessible programmable junctions formed from the terminal ends of intersecting wire segments, the plurality of programmable junctions forming a plurality of diagonally extending programming tracks, and customizing the programmable interconnect by selectively adding means for linking the wire segments at the programmable junctions.

In another aspect of the present invention there is provided a method for forming an interconnect for receiving and electrically connecting electrical components comprising preparing a programmable interconnect for connecting electrical components. The interconnect includes a first set of substantially parallel wire segments, a second set of substantially parallel wire segments nonparallel to the first set of wire segments, and a plurality of programmable junctions formed from terminal ends of intersecting wire segments. The plurality of programmable junctions form a plurality of diagonally extending programming tracks. Another step in this method includes customizing the programmable interconnect by selectively connecting wire segments at the programmable junctions.

The method further contemplates the first set of wire segments being formed in a first conductor layer and in a second conductor layer and the second set of wire segments being formed in the first conductor layer and in the second conductor layer. The wire segments from the first set of wires segments terminating at each programmable junction may also be formed in separate substantially parallel planar layers and the wire segments from the second set of wire segments terminating at each programmable junction may also be formed in separate substantially parallel planar layers. The invention further contemplates end-to-end adjacent wire segments in the first set of wire segments alternating between a first conductor layer and a second conductor layer, the first and second conductor layers, lying in separate planes and end-to-end adjacent wire segments in the second set of wire segments alternating between the first conductor layer and the second conductor layer. Further contemplated is selectively connecting at least one resistive link to the terminal end of a wire segment to substantially reduce reflections of electrical signals carried in the interconnect.

In another aspect, the present invention contemplates a method of forming and programming a multilayer programmable electrical interconnect for connecting electrical components. This alternative method includes forming a set of X-conductors and a set of Y- conductors, each set having a plurality of substantially parallel electrically conductive segments of substantially uniform length arranged end-to-end. The conductor sets are formed such that the segments of the X- and Y-conductors overlap. The method also includes forming a plurality of programmable junctions in an interconnect layer in a regular pattern each junction comprising segment ends of two X-conductor segments and segment ends of two Y-conductor segments. Programming the interconnect is performed by selectively forming electrical connections in the interconnect layer between the segment ends of the programmable junctions, to create X to X, Y to Y, and X to Y connections between the segment ends as well as combinations of the connections.

The invention further contemplates both the X-conductor segments and the Y-conductor segments being formed in a first conductor layer and a second conductor layer. Also contemplated is forming in separate substantially parallel planar layers, a first and second conductor layer, each of the two X-conductor segments terminating at a programmable junction. The two Y-conductor segments terminating at each programmable junction are also formed in separate substantially parallel planar layers, the first conductor layer and the second conductor layer. Further contemplated is end to end adjacent X-conductor segments alternating between a first conductor and a second conductor layer, the first and second conductor layers lying in separate planes, and end to end adjacent Y-conductor segments alternating between the first conductor layer and the second conductor layer. Selectively connecting at least one resistive link to the terminal ends of the wire segments at the programmable junction in order to substantially reduce signal reflections of electrical signals carried by the interconnects is also possible.

In yet another aspect of the present invention, there is provided a method for forming an interconnect for receiving and electrically connecting electrical component including preparing a programmable interconnect. The interconnect comprises wire segments, a plurality of programmable junctions formed from terminal ends of intersecting wire segments, and resistive links. This method also includes customizing the programmable interconnect by selectively connecting the wire segments at programmable junctions, and selectively connecting at least one resistive link to the terminal ends of the wire segments to substantially reduce reflections of electrical signals carried by the interconnect.

The interconnects and methods of the present invention can also utilize electrical programming to connect wire segments at the programming junctions. Electrically programmable elements can be placed within an electrical programming layer and can be addressed with electrical circuitry so that selective connections of wire segments may be made within the programmable junctions.

Further objects, features and advantages of the present invention will be apparent from a review of the detailed description of preferred embodiments which follows, when considered together with the drawings, a brief description of which follows.

DETAILED DESCRIPTION OF THE PREFERRED EMBODIMENTS

Figure 1:
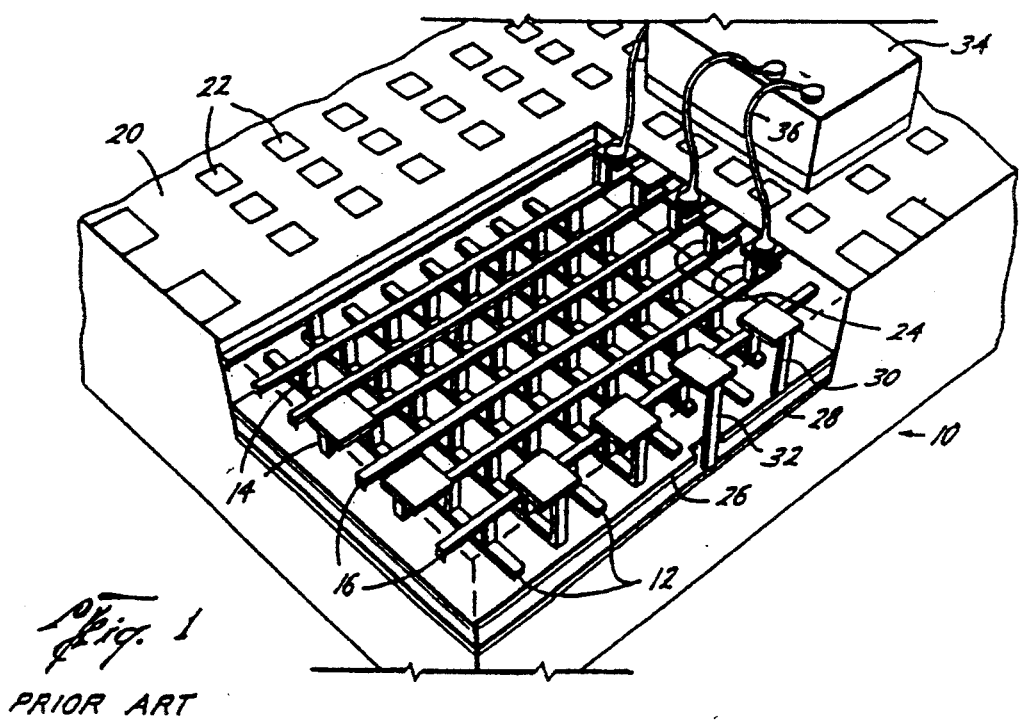
FIG. 1 is an isometric view of a presently available substrate.

FIG. 1 is an isometric, cut-away view illustrating one type of programmable interconnect design presently available, i.e., the Mosaic Systems, Inc. interconnect discussed previously. The substrate 10 includes a set of aluminum wires 12 extending parallel to one another and joined by amorphous silicon programmable bridges 14 to a set of aluminum wires 16 extending orthogonally to the wires 12. the silicon bridges are originally nonconductive amorphous silicon, but through crystallization under an electric field are rendered conductive. The wires 16 form a plane separate from and above the plane formed by the wires 12. The programmable bridges 14 form available electrical pathways between the wires 12 and 16. The wires are covered by the layer 20. The layer 20 is provided with a number of pads 22 which are connected electrically to the wires 16 by further bridges 24. The pads 22 are selectively connected to underlying voltage planes 26, 28 by extended bridges 30, 32, respectively. The pads 22, in turn, are connected to chips 34 by wire bonds 36 extending from the chips to the pads.

During the original phase of manufacture, the above design is not specified, i.e., a particular wiring scheme is not fixed. Once an application is identified and a specific wiring scheme determined, the programmable bridges can be electrically changed to conductive bridges, thus producing the requisite customized wiring scheme. While this design overcomes the limitations inherent in the design specific interconnects which require complete customization, it too is limited. First, this prior art structure is limited in the materials which can be used. Specifically, amorphous silicon must be used in order to achieve the programmable bridge property necessary for subsequent programming. As has also been noted, the density of the Mosaic design is limited by processing characteristics. Additionally, once a wire has been used to form one wire route, no matter how short a segment is needed, the entire wire must be used and thereby rendered incapable of receiving further routing; otherwise, the two routes would short circuit.

Figure 2:
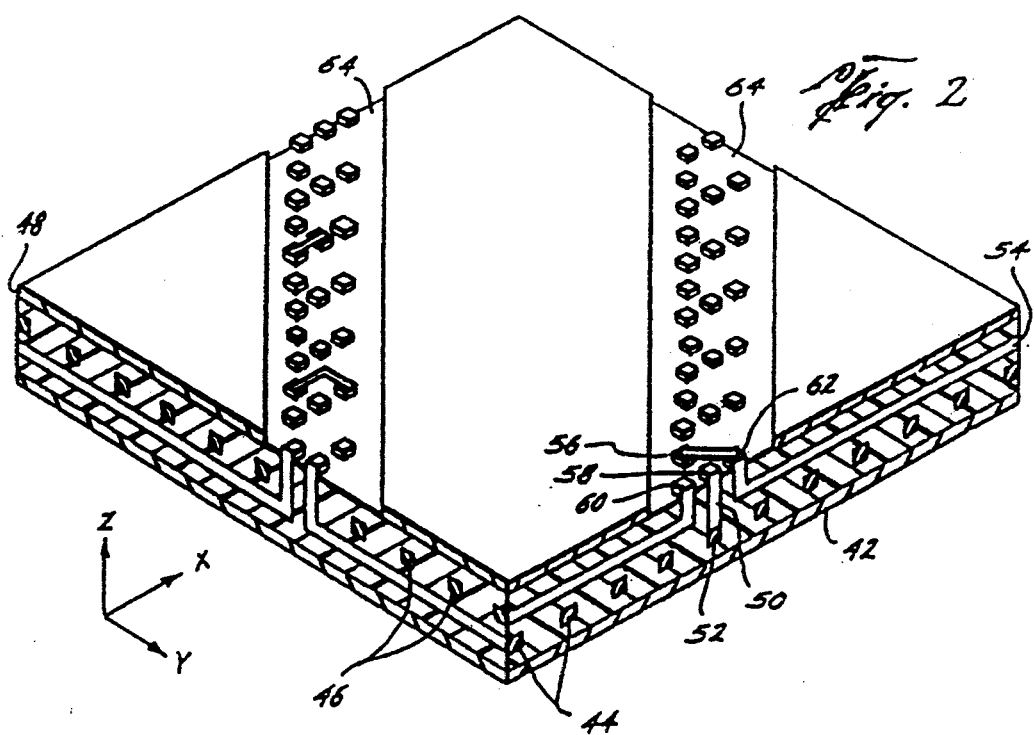
FIG. 2 is an isometric view of an interconnect according to the present invention.

The interconnect of the present invention has a sandwich structure. The actual number and types of layers depend on the particular application. FIG. 2 illustrates one type of interconnect structure according to the present invention. As illustrated, the interconnect 40 comprises an optional first plane 42. Plane 42 can be an electrically conductive plane, for example, a ground plane or a power plane. Additionally, both power and ground planes may be provided. The actual number and type of planes will depend upon user needs. For present purposes, the planes will simply be referred to as conductive planes. The conductive planes, besides their specific purposes, also help to control the impedance of the interconnect.

Extending above plane 42 is a plurality of wires 44 which are labeled as Y-axis wires for the sake of convenience and later reference. The wires 44 extend essentially parallel to one another and are coplanar. Though not shown, an insulation layer is typically positioned between the plane 42 and the wires 44, when plane 42 is present.

A second set of wires 46 is positioned above the wires 44 and extends essentially perpendicularly thereto. These wires have been marked as X-axis wires for the sake of convenience and later reference. The wires 46, like wires 44, extend essentially parallel to one another and are coplanar. The wires 44 and 46 form what will be referred to as Y- and X-planes, respectively. An insulation layer, not shown in this view, is provided between the X- and Y-planes. While the wires described here are orthogonally positioned, this is not required. Any relationship between the wires is possible, the only requirement being that the wires not be parallel so that the wires do overlap.

Finally, a customization plane 48 is positioned above the wires 46. The customization plane 48 generally provides a surface on which additional structures can be attached for carrying out other electrical processes. These structures include device attach pads, test pads, and facilities for engineering changes, defective line rerouting and overflow connections. The plane is formed so as to allow access to the terminal portions of the wires 44 and 46, as will be described in more detail immediately below.

As FIG. 2 illustrates, the X- and Y-wires are formed into line segments by terminating the wires at certain select areas of wire overlap 50. For example, wire 52, extending in the Y-direction, terminates in the area of overlap 50 with wire 54, extending in the X-direction. The terminal portions 56, 58 of the Y-wire 52 and the terminal portions 60, 62 of the X-wire 54 extend upward in the z-direction. Access areas are provided in the customization plane 48 to provide access to the ends 56, 58, 60, 62 of the wires.

The terminal ends 56, 58, 60 and 62 comprise what will be referred to hereinafter as a "programmable junction." The ends of the wires are linked to one another at the programmable junctions to establish the required wiring sequence in the interconnect, commonly referred to as routing. The access areas in the customization plane 48 allow the end user to access the terminal ends and interconnect same to achieve any routing scheme desired.

It has been discovered, in accordance with the present invention, that preferable and advantageous wiring results are achieved by forming the programmable junctions in a diagonally-extending pattern. As FIG. 2 illustrates, a diagonal track 64 has been formed through and across the customization plane 48 and the underlying diagonally-extending programmable junctions 66 are accessible therethrough. These diagonal tracks will be referred to as "programming tracks."

Figure 3:
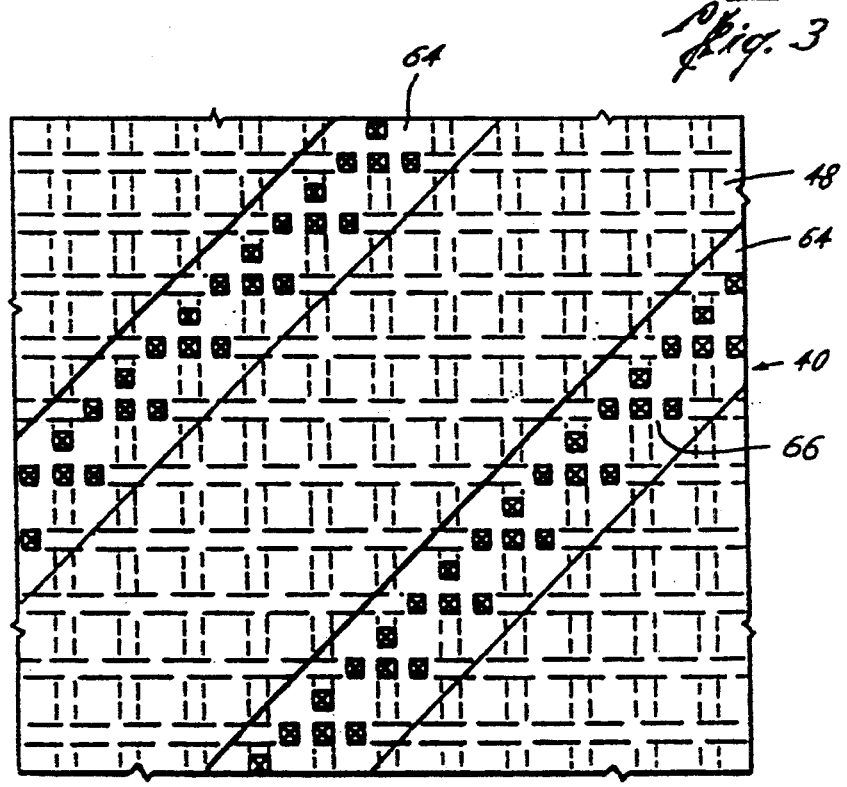
FIG. 3 is a plan view of the interconnect of FIG. 2.

FIG. 3 is a plan view of the upper customization plane 48 and interconnect 40 shown isometrically in FIG. 2. The programming tracks 64 and programmable junctions 66 can be seen in FIG. 3. The programming tracks can extend in the same direction (a single pattern) or can be perpendicularly positioned to extend diagonally across the interconnect in either direction (a "double" pattern). The double track pattern, on the one hand, is advantageous since it provides a greater number of programmable junctions and therefore, greater flexibility for routing purposes. However, for most applications, the single track pattern will be sufficient. This is true for a variety of reasons. First, the single track pattern is simpler to design. Second, it is more compatible with integrated chips having tape automated bonding (TAB), a common means of chip bonding to be discussed below. Also, the single pattern typically offers more than enough programmable junctions for wiring purposes, both as to flexibility and directional changes, i.e., bus-type structures. Also, because the "single" track pattern utilizes fewer programmable junctions than the "double" track pattern, it is advantageous because excessive programmable junctions may detrimentally affect the electrical properties, as well as the yield, i.e., manufacturing defects.

The programming tracks extend diagonally across the interconnect. Preferably, and especially with orthogonal wiring, the programming tracks extend diagonally across the interconnect at a 45 degree angle. However, the tracks can assume any angle depending solely on user needs. Also, the programming tracks do not have to be linear. The tracks can assume any geometry, again depending on user needs. Saw-tooth tracks, serpentine tracks and others are possible. The pitch (P), as a measure of the distance between successive programming tracks, is determined by the required flexibility of interconnect routing. The selection of the pitch is determined by the balance of the advantage of more locations at which directions may be changed and increased customization layer surface for attachment, testing, and additional wiring. The pitch (P) as a measure of the distance between successive X-wires or Y-wires is as small as possible in order to increase the number of possible programmable junctions.

Figure 4:
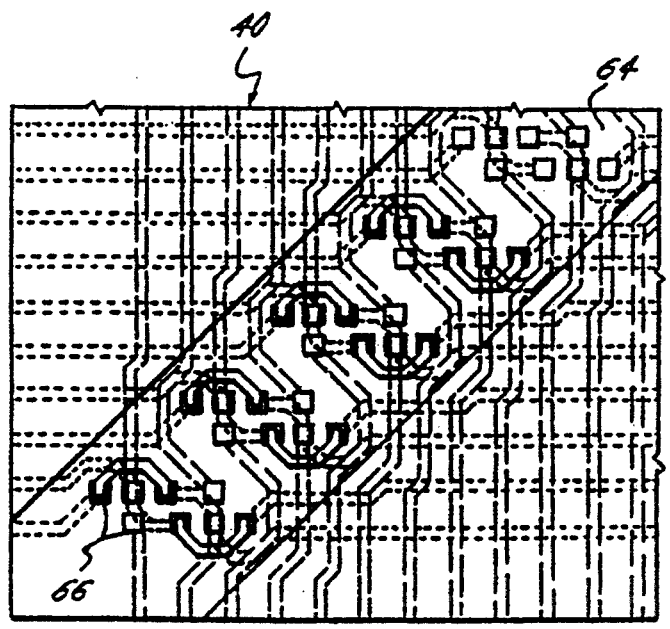
FIG. 4 is a plan view of the preferred embodiment of the programming tracks and programming junctions.

FIG. 4 illustrates a preferred embodiment of the programming tracks 64, and especially the programmable junctions 66 therein. As shown, the programmable junctions of adjacent wires are offset from one another along the programming track. This design allows higher line density in cases where the via diameter is greater than the line width, or in any similar situation where the programmable junction tends to limit the line-to-line spacing. This configuration also allows wiring to pass between the programmable junctions on the upper (customization) plane.

The diagonal programmable tracks are also advantageous because the length of connections between the wires is minimized. As FIG. 3 illustrates, the programmable junctions 66 position the four wire ends from the X- and Y-wires in close proximity to one another.

Figure 2A:
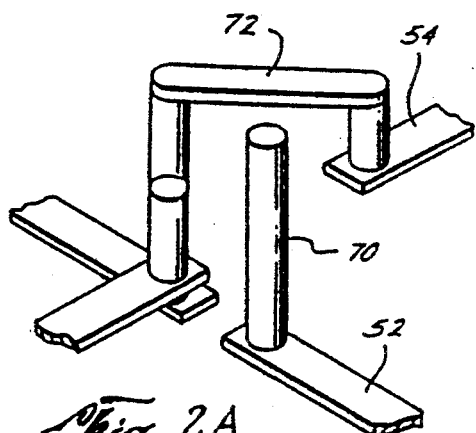
FIG. 2A is an enlarged sectional view of the pillar interconnect between the wiring structure of FIG. 2.
Figure 5:
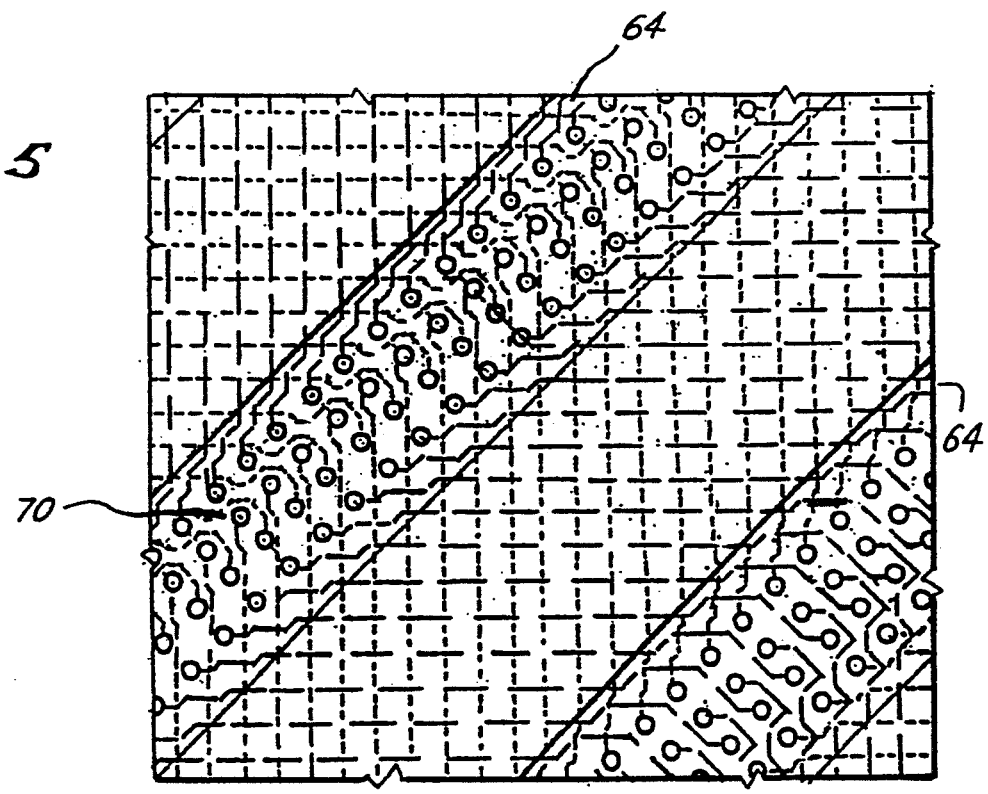
FIG. 5 is a plan view of an interconnect with pillars diagonally orthogonal to the programming tracks.

The connections between the wires are illustrated, for example, in FIG. 2A. FIG. 2A is an enlargement of an area of overlap, such as overlap 50 of FIG. 2. For reference purposes, the same reference numbers will be used. As shown, wire 52, extending in the Y-direction, and wire 54, extending in the X-direction, terminate at overlap 50. The wires extend in different, but parallel, planes. Extending upward from the wires are electrically conductive pillars 70. These pillars 70 extend upward to a plane which forms the programmable junctions. As FIG. 2A shows, because wire 54 is in a plane above the wire 52, the length of the pillars from wire 54 to the interconnect plane is less than from wire 52 to the plane. The pillars as shown in FIGS. 2A and 3 illustrate the terminal ends thereof in essentially a T-shape. Advantageously, the pillars may extend along a diagonal orthogonal to the programming tracks. Such a layout facilitates routing access across programming tracks for wiring on the customization plane. FIG. 5 displays one example of diagonally placed pillars 70 orthogonal to programming track 64. Such a layout facilitates routing access across programming tracks for wiring on the customization plane.

Referring still to FIG. 2A, the final component in the interconnect region is the link 72 between the pillars 70. The link 72 extends from the upwardly facing ends of the pillars and provides an electrical connection between the pillars, and thus the underlying wire structure.

Figure 6:
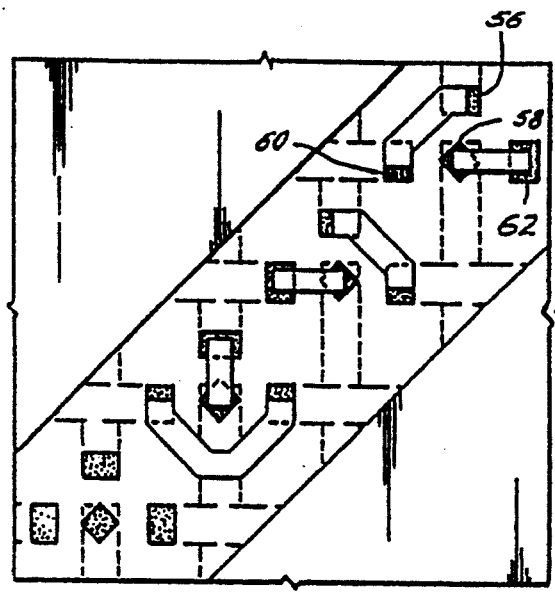
FIG. 6 is an enlarged plan view of the diagonal interconnect region of FIG. 3 according to one embodiment of the present invention.
Figure 6A:
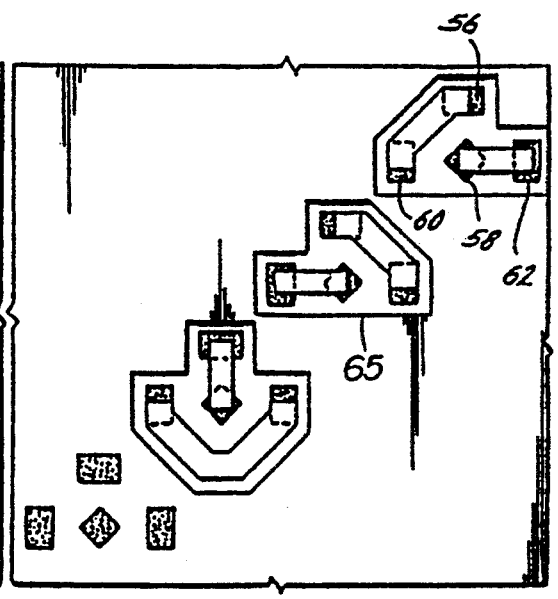
FIG. 6A is an enlarged plan view of the diagonal interconnect region of FIG. 3 according to another embodiment of the present invention.

The process of specifying and then forming the interconnections between the wires represents the customization of what is an otherwise undedicated interconnect. Through customization, the various wire segments can connect in a variety of different manners as depicted by FIGS. 6, 6A, 7 and 7A. FIGS. 6 and 6A parallel one another in the type of connections made, but differ in the design of the customization plane, a matter to be discussed in more detail below. For reference purposes, the ends of the pillars will be numbered in a fashion similar to FIG. 2, with the customization Y-wire end (Y1) being end 56, the lowermost Y-wire (Y2) being end 58, the leftmost X-wire (X1) being 60 and the rightmost X-axis wire end (X2) being 62. As the figures illustrate, the wire ends can be connected in a variety of different arrangements, for example, X1-X2, X1-Y1, X1-Y2, X2-Y2, or any combination thereof. The application of the links to the wires is known as "additive" customization. This configuration also allows the use of the same programmable junction for two independent nets, often called "knock-knee" connections.

Figure 8:
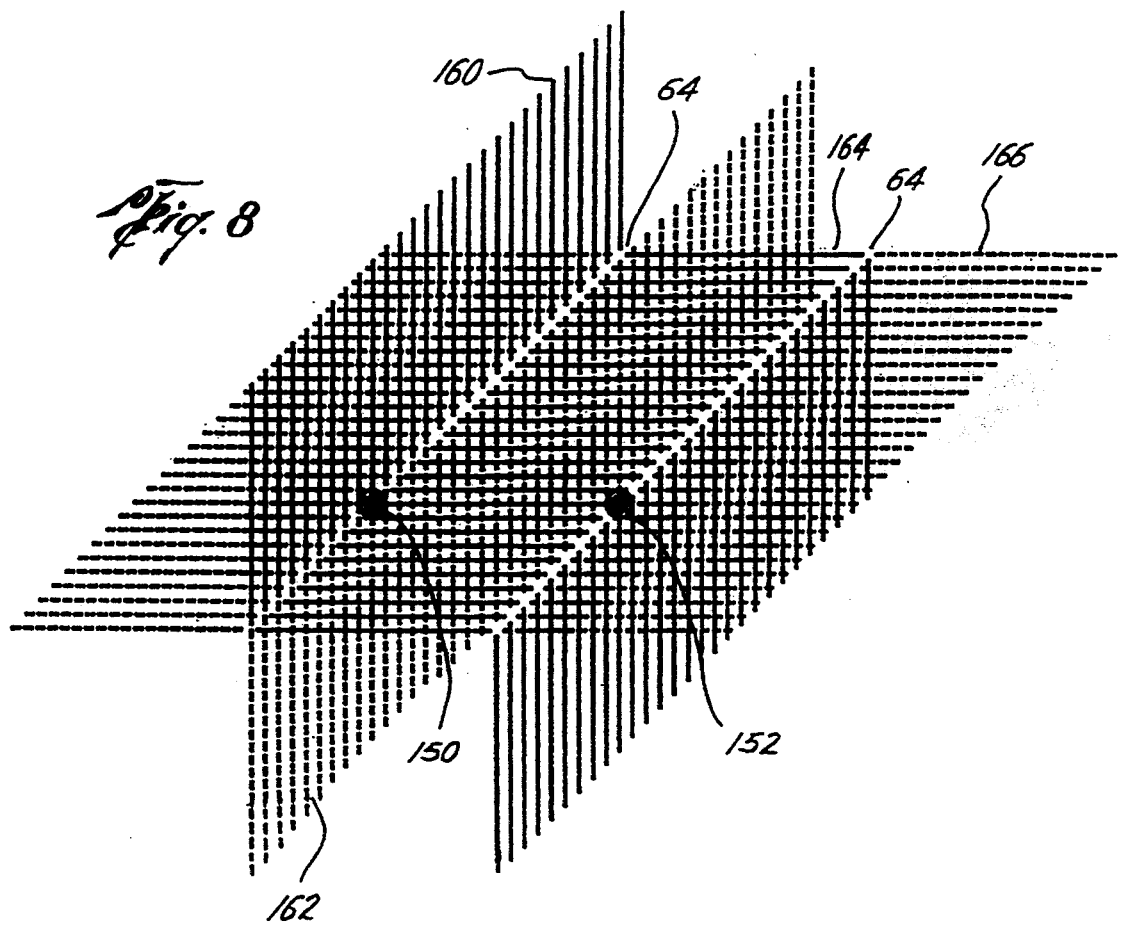
FIG. 8 is a plan view of an interconnect with X- and Y-conductor segments placed in alternating layers.
Figure 9:
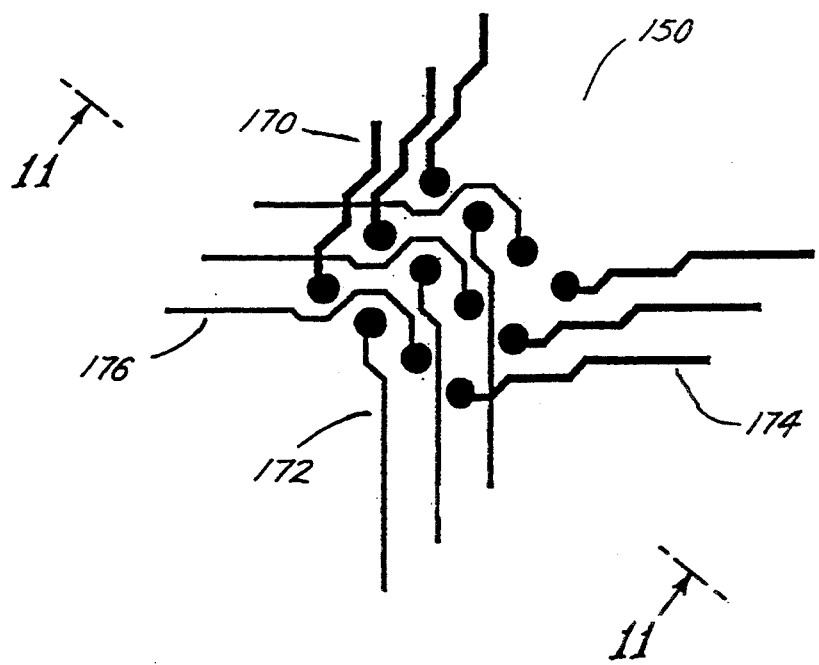
FIG. 9 is a plan view of an embodiment of the programming junctions of FIG. 8.
Figure 10:
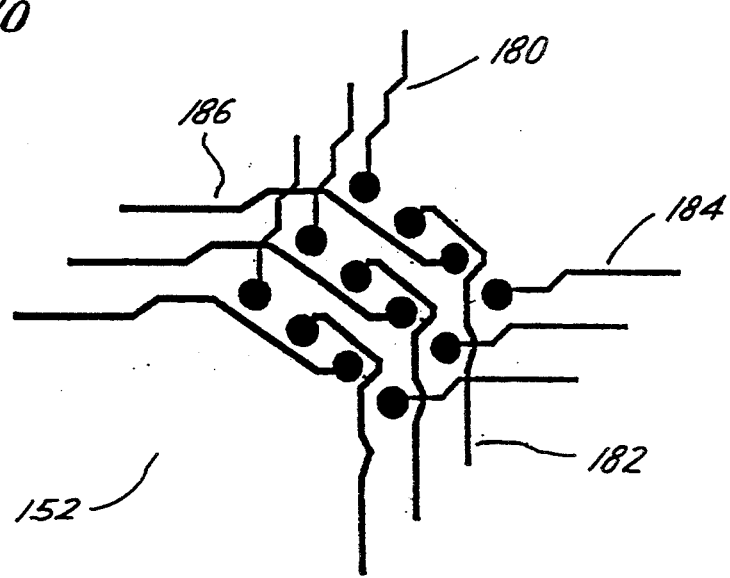
FIG. 10 is a plan view of another embodiment of the programming junctions of FIG. 8.

FIG. 8 shows another embodiment of the interconnect design. In this embodiment the X-conductors and the Y-conductors alternative between upper and lower conductor layers. In FIG. 8, solid lines indicate conductors in the upper conductor layer while dashed lines indicate conductors in the lower conductor layer. End-to-end adjacent X-conductor segments and end-to-end adjacent Y-conductor segments switch layers at each programming track. Thus, as seen in FIG. 8, upper layer Y-conductor segments 160 end at programming track 64 where the adjacent Y-conductor segments are lower level Y-conductor segments 162. Similarly, upper layer X-conductor segments 164 are adjacent to lower X-conductor segments 166. Programming junctions 150 are shown in more detail in FIG. 9 and programming junctions 152 are shown in more detail in FIG. 10. For illustrative purposes, FIGS. 9 and 10 show slightly different routing patterns for connecting the segments with the diagonal pillars within the programming junction. Many such routing patterns may exist and the determination of which pattern to use would depend on the user's needs and requirements.

In both FIG. 9 and 10, thick lines represent segments in the upper conductor layer while thin lines represent segments in the lower layer. Both FIGS. 9 and 10 display three individual programming junctions. In FIG. 9, upper layer Y-conductor segment 170 ends adjacent to lower layer Y-conductor segment 172 and upper layer X-conductor segment 174 ends adjacent to lower level X-conductor segment 176. Likewise, in FIG. 10 lower level Y-conductor segment 180 ends adjacent to upper level Y-conductor segment 182 and lower level X-conductor segment 184 ends adjacent to upper level X-conductor segment 186.

Figure 11:
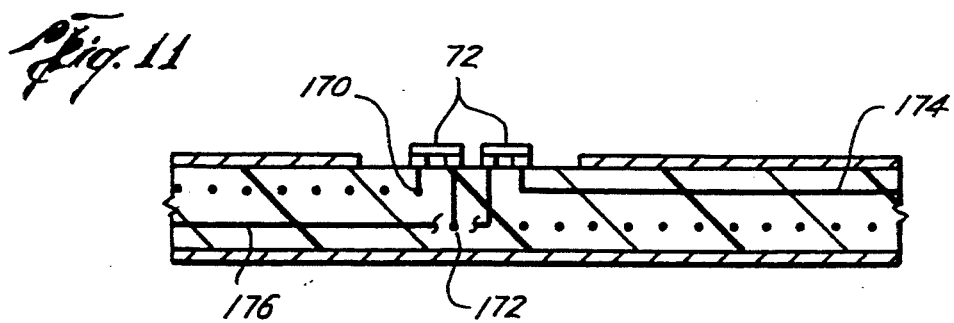
FIG. 11 is a cross-sectional view of one of the programming junctions of FIG. 9.
Figure 12:
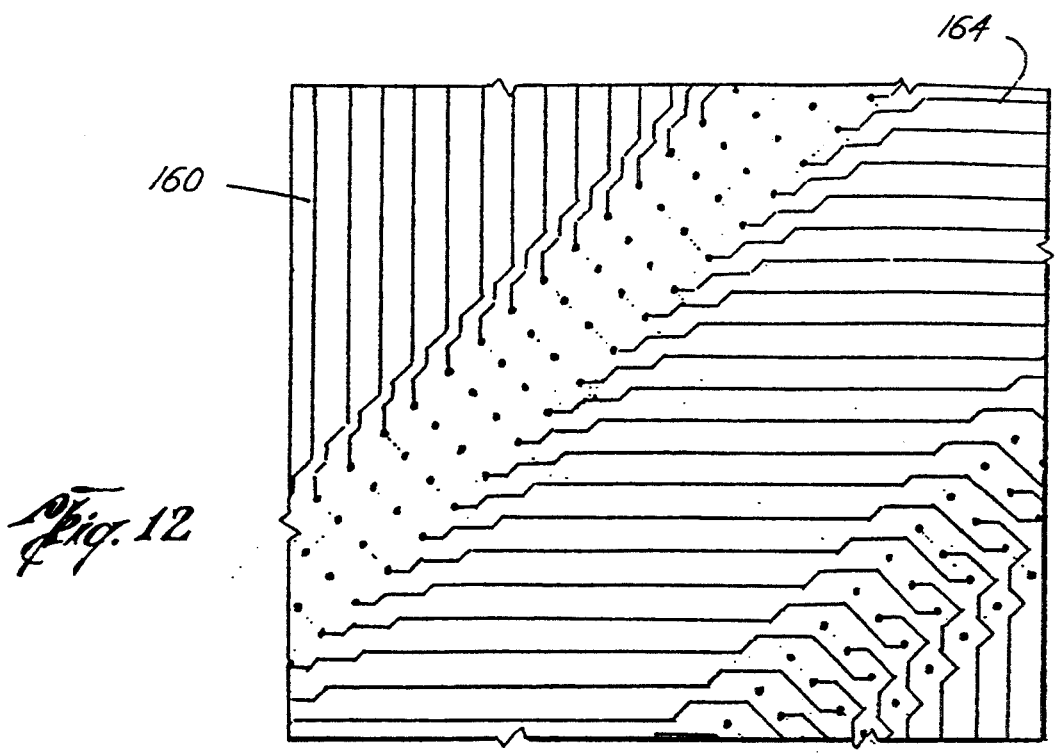
FIG. 12 is a plan view of the upper layer of an interconnect with X-conductor segments and Y-conductor segments on alternating layers.
Figure 13:
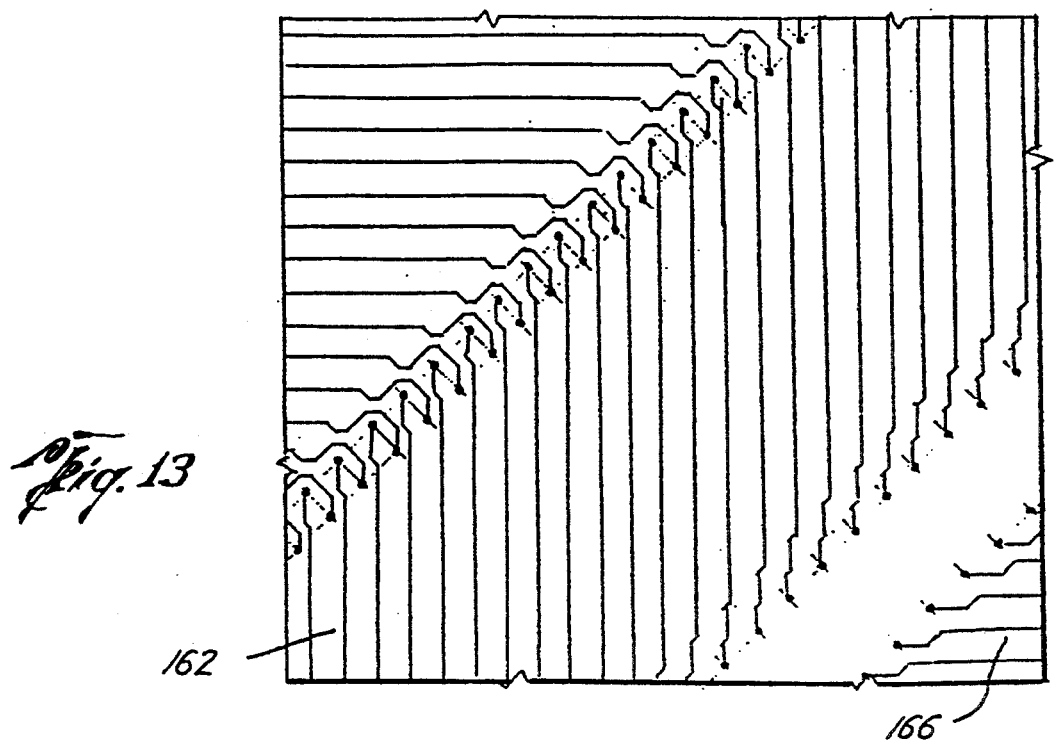
FIG. 13 is a plan view of the lower layer of an interconnect with X-conductor segments and Y-conductor segments on alternating layers.

A cross-sectional view of the programming junction formed by segments 170, 172, 174 and 176 in FIG. 9 is shown in FIG. 11. In FIG. 11, upper level X-conductor segment 174 ends adjacent to lower level X-conductor segment 176. Upper level Y-conductor segment 170 ends adjacent to lower level Y-conductor segment 172. Links 72 are shown making X1-X2 and Y1-Y2 type connections. These connections are only used as illustrations however, and any combination of X to X, X to Y, or Y to Y connections may be made. In the embodiment of FIG. 8, the upper layer has both X-conductor segments 164 and Y-conductor segments 160 as shown in FIG. 12. Likewise, the lower layer also has both X-conductor segments 166 and Y-conductor segments 162 as shown in FIG. 13. As can be seen from FIGS. 8, 12 and 13, the X- and Y-conductor segments are on different planes at any given point. The segments, however, alternate between layers. Alternating the layers of the X- and Y-conductor segments is advantageous because the capacitive coupling to ground is more uniform between X-conducting routes and Y-conducting routes. Thus, interconnect routing which travels primarily in X-conductor segments will have a capacitive coupling similar to interconnect routing which travels primarily in Y-conductor segments.

Figure 7:
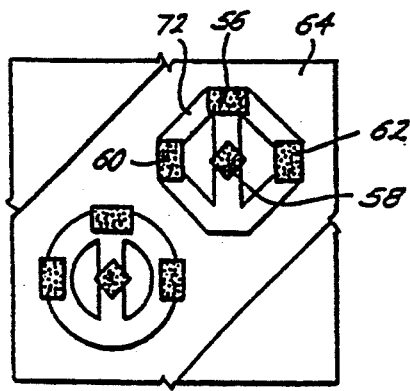
FIG. 7 is an enlarged plan view of the diagonal interconnect region of FIG. 3 according to one embodiment of the present invention.
Figure 7A:
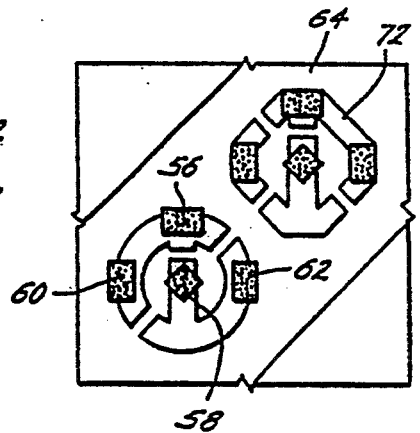
FIG. 7A is an enlarged plan view of the diagonal interconnect region of FIG. 7 after subsequent processing.

FIGS. 7 and 7A show another embodiment of the interconnect design, i.e., "subtractive" customization, in which a continuous connection shorting all four wire ends is provided. The interconnect can undergo a subtractive process, e.g., laser etching, to disconnect select ends, thus defining the specific links. Subtractive customization also allows the simultaneous formation of programmable links, attachment pads, additional wiring, etc. Alternatively, an entire layer of link material may be placed over the interconnect prior to customization. Then through subtractive customization the links may later be defined. The entire layer of link material may be used to protect and passivate the interconnect if customization occurs a long period of time after the interconnect is manufactured. Protection and passivation may also be provided by covering the interconnect with a polymer or metal layer that will then be removed prior to customization.

Figure 14:
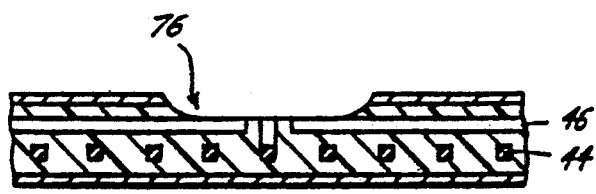
FIG. 14 is a cross-sectional view of another embodiment of the interconnect of the present invention.

The interconnect plane or layer formed by the terminal wire ends can be positioned at a variety of heights measured in the z direction. As shown in FIG. 2, the interconnect plane can be parallel to the customization plane 48. In this embodiment the programming tracks 64 are formed in the customization plane and aligned with the diagonally-extending programmable junctions. In another embodiment, the interconnect plane is parallel to the plane formed by the upper set of wires. FIG. 14 illustrates this embodiment. In order to provide the necessary access to the interconnect region, a personalization "trench" 76 is formed in the upper layers of the interconnect 40. The base of the trench terminates in the plane formed by the upper set of wires 46. Such an arrangement offers advantages over the embodiment in which the programming tracks are coplanar with the upper customization plane. As a result of the design of FIG. 14, the pillars extending upward from wires 46, i.e., the top set of wires, are eliminated. In addition, the pillars extending from the lower set of wires 44 are reduced in length. The result is, in effect, a 66% reduction in the pillars necessary to bring the wire segment ends to the interconnect plane.

Figure 15:
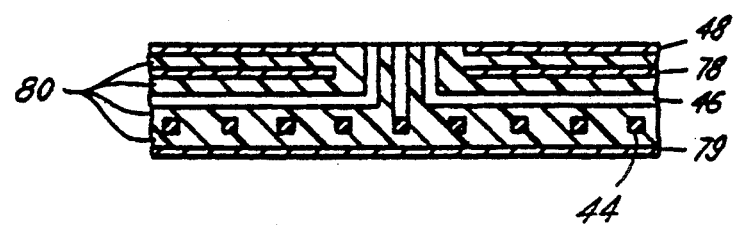
FIG. 15 is a cross-sectional view of one embodiment of the interconnect of the present invention.

The personalization trench can even be extended downwardly to the lower set of wires. This embodiment completely eliminates the need for pillars. In yet another embodiment of interconnect design, as illustrated in FIG. 15, a separate reference plane 78 is positioned between the upper set of wires 46 and the customization layer 48. The additional reference plane 78 provides for electric field isolation between the wires 44 and 46 and the structures on the customization plane 48, including programmable junctions, the chip attach pads, engineering changes, overflow wiring, etc.

In other embodiments, a first and second reference plane are provided on either side of the wires, for example, in FIG. 15, plane 78 and 79 on either sides of wires 44 and 46.

FIG. 15 also reflects the provision of insulation 80 between the various interconnect layers. Typically, the interconnect sandwich, in cross-section, comprises metal separated by insulation. A variety of metals, for example, gold, copper, tungsten, are useful. A particularly preferred metal is copper. Also, the various layers can utilize different metals. Though not illustrated by the figures, it is also envisioned that, rather than an entire insulative layer, insulative strips may be used between the wire segments. Any electrically insulative material may be used. Preferred insulative materials include polyimide, ceramic, glass-epoxy laminates, and PTFE-glass boards. The polyamides are particularly preferred where the desired construction of the invention is for smaller interconnects.

Figure 16:
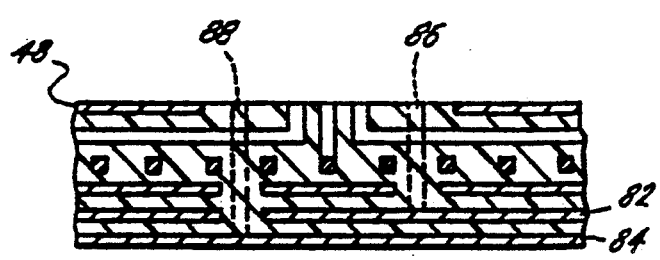
FIG. 16 is a cross-sectional view of yet another embodiment of the interconnect of the present invention.

FIG. 16 shows another embodiment of the interconnect according to the present invention. The interconnect includes multiple power planes 82 and 84. The exact number of power planes is determined by interconnect application. Similarly one or more planes may be a ground plane. These planes, whether ground or power, can simply be referred to as conductive planes. As illustrated, pillars 86, 88 extend upward through the interconnect to electrically connect the power planes 82 and 84, respectively, to the customization layer 48. Should these additional pillars overly complicate the interconnect structure, it is possible to address the power concerns by using the two reference planes, or an external structure onto which the interconnect may or may not be attached.

The determination of which of the various interconnect topologies to utilize will depend upon a comparison of the user needs and the tradeoffs in fabrication ease, customization ease, cost, performance, etc.

Figure 17:
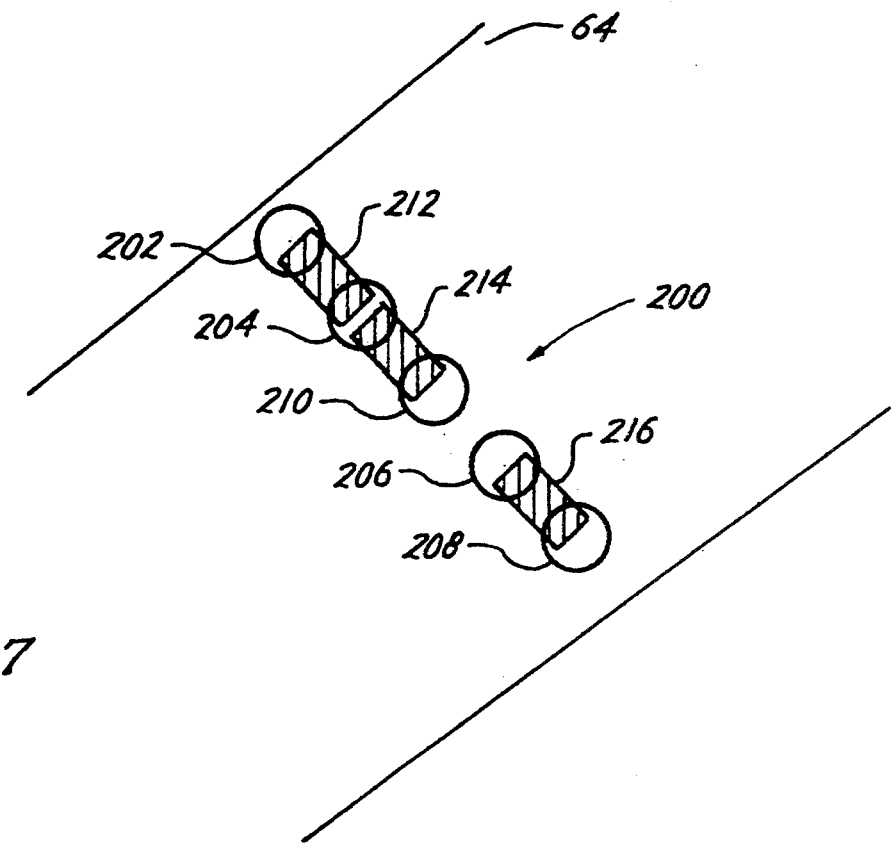
FIG. 17 is a plan view of a programming junction with diagonal pillars and connecting links.

One such interconnect topology may be seen in programming junction 200 in FIG. 17. In FIG. 17 Y terminal ends 202 and 204, X terminal ends 206 and 208, and a conductive plane connection or pillar 210 are arranged to extend along a diagonal orthogonal to programming track 64. Links 212, 214 and 216 demonstrate some of the possible electrical connections between the terminal ends and the conductive plane.

Figure 18:
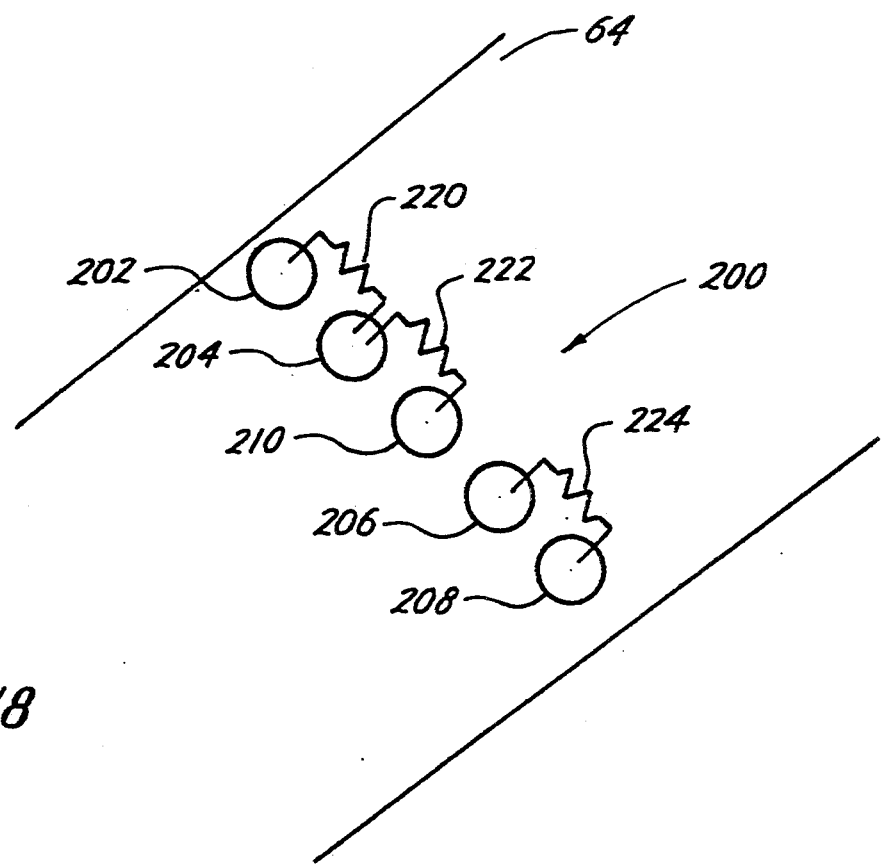
FIG. 18 is a plan view of a programming junction with a schematic representation of the use of resistive links.
Figure 19:
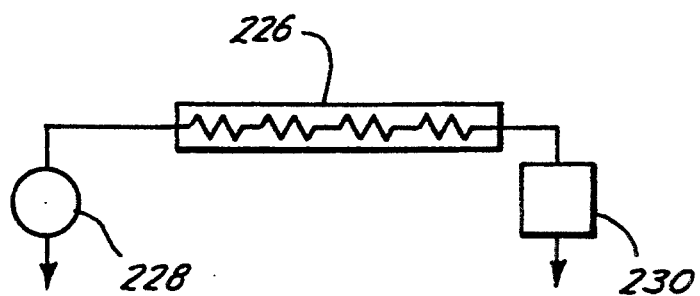
FIG. 19 is a schematic view of multiple resistive links creating a distributed resistance along an interconnect route.

The programmable interconnect of the present invention also has the benefit that it provides means to simply match the resistance and the characteristic impedance along an interconnect route in order to substantially reduce signal reflection or ringing. This is achieved by using selected links with a higher resistivity. The resistance chosen for each link will depend upon the number of links in the signal transmission path, the desired transmission line impedance and the number of links that will have a higher resistivity. It is anticipated that the desirable resistance for resistive links is greater than approximately 0.1 ohms per link while non-resistive links have a lower resistance that is less than approximately 0.1 ohms per link. Thus, links 212, 214, and 216 may be replaced with resistive links 220, 222, and 224 as seen schematically in FIG. 18 where resistor symbols represent the resistive links. For example, FIG. 19 displays the resulting electrical circuit if a series of resistive links such as links 220 or 224 are used to connect the wire segments that create a specific interconnect route 226 between a source 228 and load 230. Combined the series of resistive links creates a lossy transmission line with a distributed resistance.

The characteristic transmission line impedance of the interconnect, $Z_0$, and the total resistance of the interconnect route, $R_I$ (the sum of the resistance of all the links and wire segments in the route), should be matched so as to substantially reduce signal reflection or ringing. The relative values of $Z_0$ and $R_I$ will vary depending on the user's specific application and needs. It is desirable that signal reflection be low enough so as to decrease signal distortion below a circuit's tolerance level while still not over attenuating the signal beyond circuit requirements. For some uses, reflection should be less than 10% of the total signal swing. Thus it would be desirable that reflections in a 5 volt system be kept below 0.5 volts.

The present invention thus provides one linking mechanism which may both program a programmable interconnect and enable substantial signal reflection reduction. The advantages of this method include a reduction of processing steps, circuit space savings as compared to large discrete resistors and lower manufacturing costs.

Figure 20:
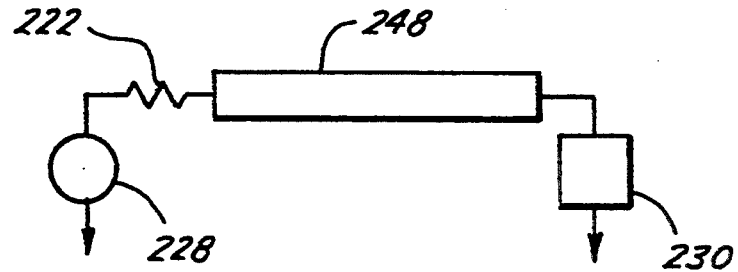
FIG. 20 is a schematic view of a single resistive link in series with an interconnect route.

It is recognized that various materials such as chrome, tungsten, titanium, nickel chrome or other materials may be used to create resistive links. Varying the link material enables the resistance of each link to be adjusted. Varying the link geometry also enables the resistance of each link to be adjusted because the resistance is a function of the ratio of the link length to link cross-sectional area. Not all links on an interconnect need have the same resistance and not all links must be resistive links. Thus, flexibility exists in customizing the interconnect. A series of links such as discussed above with reference to FIG. 19 may be used or other approaches can be utilized. For example, even a single resistor between a signal source and an interconnect route may be placed using resistive links. If conductive plane connection 210 connects to a power plane and link 222 is a resistive link, the analogous resulting electrical circuit, seen in FIG. 20, has source 228, resistive link 222, interconnect route 248, and a load 230.

Figure 21:
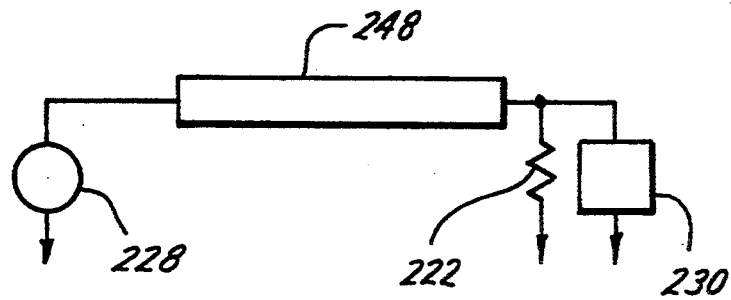
FIG. 21 is a schematic view of resistive links creating a shunt resistance to ground across a load.

Alternatively, in accordance with the present invention a resistance may be placed in parallel with a load in order to reduce signal reflections by using shunt resistor methods. For example, if conductive plane connection 210 connects to a ground plane, and link 222 is a resistive link, then an analogous circuit can be seen in FIG. 21 with resistive link 222 creating a shunt resistance across a load 230. It is recognized that the shunt resistance may be created by multiple parallel resistive links connecting an interconnect route with the ground plane. Of course the resistivity used for each link, whether used in series or parallel, will depend on the user's application. For example, generally a single parallel resister must have a higher resistance that the resistance of each individual series resistance if multiple resisters are used in series.

It should be recognized that various interconnect topologies and programmable junctions may be used with resistive links. The determination of which resistive link application and the determination of which interconnect topology and programmable junction to use will depend upon the user's specific circuit requirements.

The areas for passage of the pillars to the interconnect plane and/or customization plane are commonly referred to as "vias." The present interconnect design is such that the vias do not block the various wiring channels since the wires terminate in the areas of X-Y intersection and the vias are positioned in the termination areas. The design further allows for advantageous wiring compactability, for example, more than 500 lines per inch per layer are possible using 15 micron lines and 30 micron spaces. Higher line densities are possible with the only limitation being the lithographic capabilities.

Figure 1A:
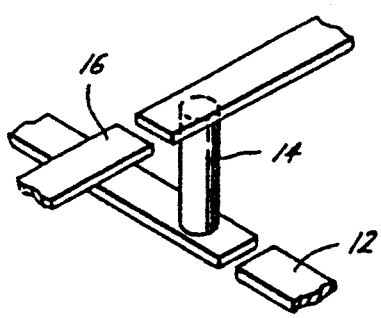
FIG. 1A is an enlarged isometric sectional view of a blind via of the prior art non-universal substrates.

The present vias are accessible from the exterior of the interconnect and are designed such that the programmable junctions therein can be accessed to customize the routing. FIG. 1A illustrates the prior art via design, known as a "blind via." In the prior art, as each successive layer is applied, the lower layers become buried, making it impossible to access the interconnect structure externally. Since the vias used to interconnect lower layers are buried in the same process, they are inaccessible for further customization and are known as blind vias. While blind vias are not disadvantageous per se, they can create difficulty in situations requiring further changes or modifications as well as complicate the testing process. For these reasons, it is advantageous, where possible, to eliminate blind vias by providing access to all vias.

The use of wire segments in the interconnect allows for infinite pitch flexibility in the programming tracks. Also, since a series of wire segments are used rather than one continuous wire, use of a segment for one routing purpose does not disable use of the other wire segments in that wiring channel for other purposes. As was pointed out, disabling of entire wires is a drawback of the Mosaic electrically programmable design as depicted in FIG. 1.

Figure 22:
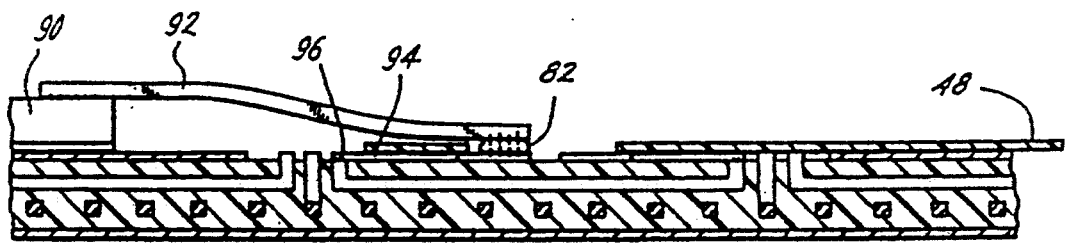
FIG. 22 is an enlarged cross-sectional view of the specified area of FIG. 31.
Figure 23:
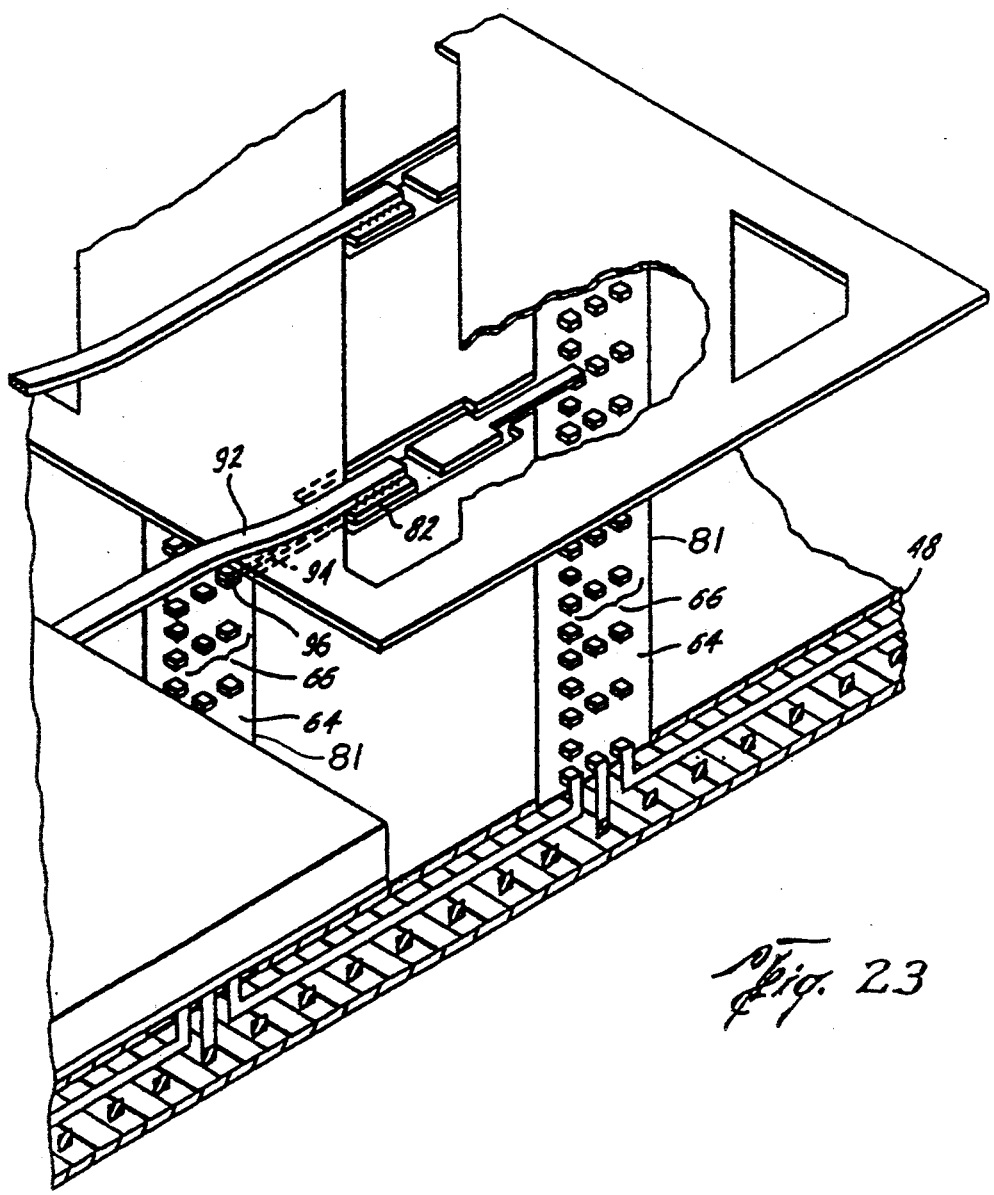
FIG. 23 is an enlarged isometric view of the area specified in FIG. 31 according to one embodiment of the present invention.
Figure 24:
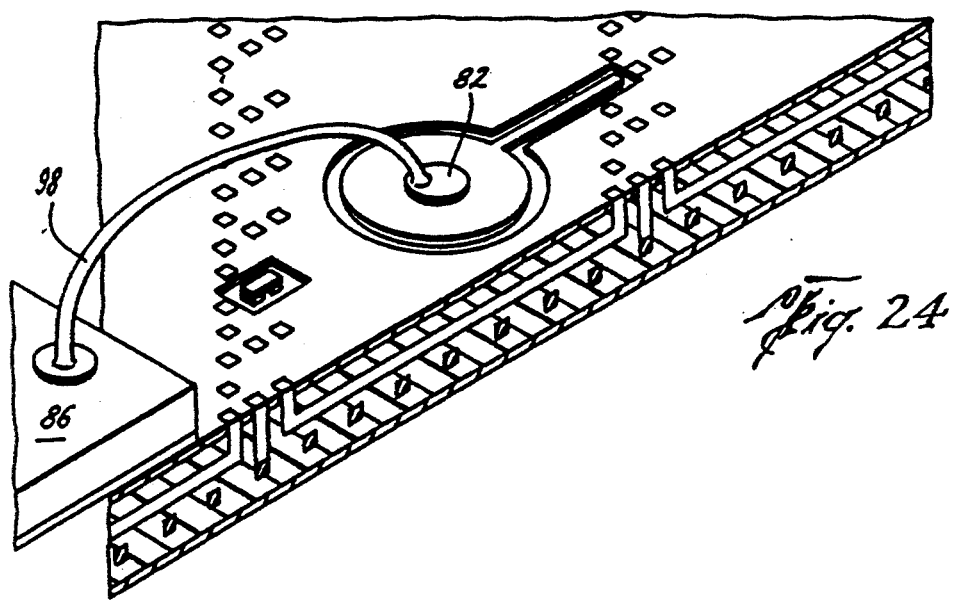
FIG. 24 is an enlarged isometric view of the area specified in FIG. 31 according to another embodiment.

The customization layer 48 of the interconnect is shown in more detail in FIGS. 22-24. A review of these figures reflects the variety of designs the layer can assume. FIG. 23, for example, comprises layer 48 having the continuous diagonal access tracks 81 which provide access to the programming tracks 64 previously described and illustrated in FIGS. 2 and 3. The tracks correspond to and overlay onto the underlying diagonally-extending programmable junctions 66. FIG. 6A illustrates a customization layer 48 having access regions in the form of cut-away portions 65 which provide access to the wire segment ends. Other modifications of the customization layer topography are possible, the primary objective simply being to allow access to the wire segment ends so that the necessary customization of the wiring routing can be achieved.

Besides providing for wire connections, the customization layer includes pads 82, see, for example, FIG. 22, for bonding to the leads from the integrated circuit chips. The pads can be formed in the same plane as the wire interconnect region, and can be arbitrarily placed within the space separating the diagonal tracks or cutaways. As shown in FIG. 22 a chip 90 attaches to the customization layer 48. The chip includes leads 92 which extend from the chip and bond to the interconnect at the bonding pads 82. This process is referred to as outer lead bonding (OLB). The connection can, for example, be by means of a solder bump extending from the bond pad to the lead. The pads 82, in turn, are electrically connected, as part of the customization of the interconnect, to select wire segment ends. As shown in FIG. 22, a connector 94 extends from the pad 82 to the wire end 96. FIG. 23 is an isometric representation of the interconnect of FIG. 22. The structures are similarly referenced.

Figure 23A:
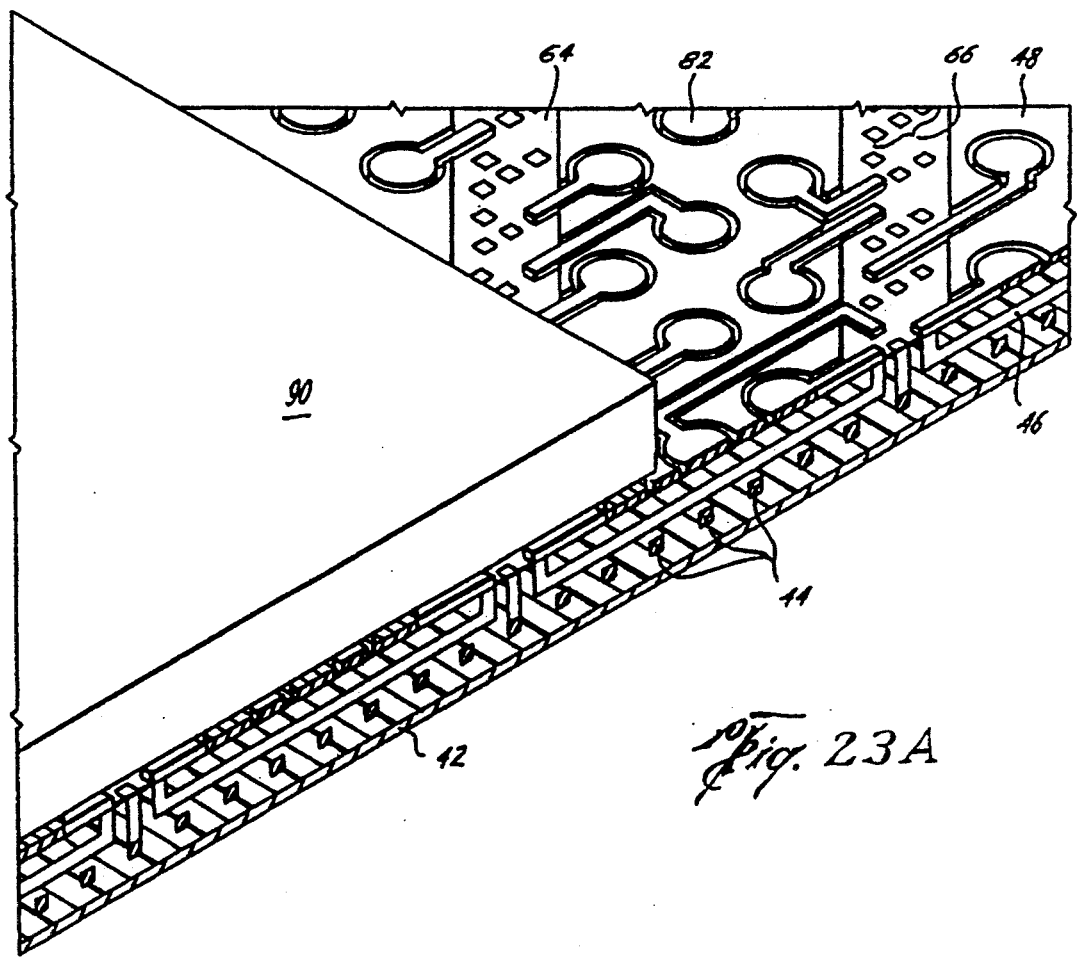
FIG. 23A is an enlarged isometric view of the area specified in FIG. 31 according to another embodiment of the present invention.

FIG. 23A illustrates a further design of the customization layer 48 and OLB pads 82. The pads are circumferential, resembling islands in the customization layer, and the customization layer is contoured in a similar fashion. The customization layer includes the diagonal tracks. FIG. 24 shows a lead 98 extending from the chip 86 to the bonding pad 82.

The interconnect of the present invention, and particularly the customization layer thereof, is compatible with a variety of OLB techniques, for example, tape automated bonding (TAB), wire bonding, C4 bonding, etc. TAB-type bonding is particularly preferred and will be described in more detail below.

The selection of bonding pad sites is part of the interconnect customization. If only one outer lead bond is to be formed between diagonal access areas, the pads can be arranged in a straight line. If more than one bond is going to be present between programming tracks, the pads can be staggered. The interconnect is compatible with either area or peripheral bonding.

As noted above, TAB-type bonding is a particularly preferred means for bonding the interconnect to integrated circuit chips. TAB-type bonding involves the mounting of the integrated circuit chips on a carrier film or tape. The tape, for example, may comprise a very thin polyimide strip. The chip is affixed to the tape by means of the chip's outer signal and power leads. These leads are generally formed of copper and typically plated with tin, or noble metals such as gold, platinum, etc.

Typically, the leads extend from the centrally positioned chip in all directions. The leads generally have inner and outer lead bondsites. The inner lead bondsites (ILB's) connect the lead to the chip; the outer lead bondsites (OLB's) connect the leads to the interconnect. Because of the small scale at which the bonding must be performed, it is desirable to have center-to-center distances between adjacent OLB's sufficient to prevent overlap of the binding connections between two bondsites which result in shorting the connection. This design objective, however, must be balanced against the need to use as little bonding area as possible in order to allow compact chip mounting. In other words, if one were to spread out the OLB's over an interconnect to facilitate the bonding of the individual leads to the interconnect, it would result in the adjacent chips being positioned at greater distances from one another and thus fewer chips per unit area could be accommodated.

The present interconnect circuitry also includes the provision of a tape design for improved tape automated bonding for use with the present interconnect. The present tape design provides an improved means for bonding between the tracks and for maximizing the number of bondsites along a staggered row of sites. The tape design of the present invention also allows for more dense packing of chips onto an interconnect due to the shorter outer lead bonding length.

Figure 25:
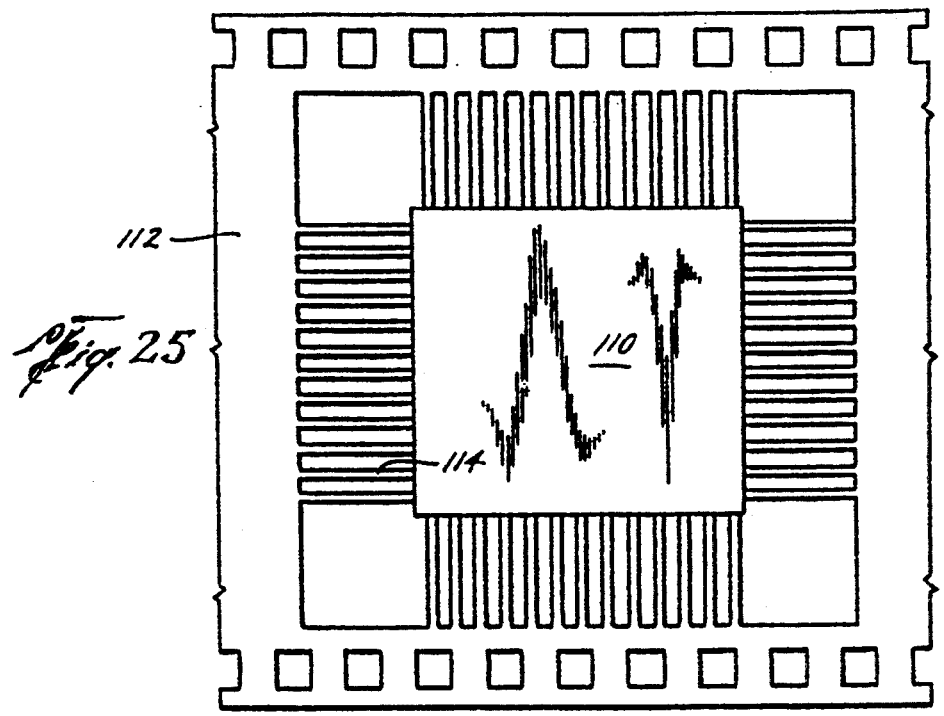
FIG. 25 is a schematic view of a carrier film having a chip attached thereto.

FIG. 25 schematically illustrates a typical "Tape Automated Bonding" (TAB) chip. As illustrated, a semiconductor integrated circuit chip 110 is affixed to a carrier film, or tape, 112 by means of outer leads 114. The tape is formed from an insulative material, for example, a polyimide. The polyimide tape is then covered on one side with a conductive metal, for example, copper. The copper layer is then etched to form the desired lead pattern, with the non-etched copper areas forming the resultant leads. The polyimide tape is also etched or stamped to form an area for receiving the chip 110. This etch or stamp is generally performed in the center of the tape at the inner terminations of the leads. The non-etched leads are typically then plated with tin, gold or other noble metals. The chip is then placed onto the tape and ILB's (inner lead bonds) are formed between the chip and the inner terminal portions of the leads. The OLB's have a peripheral design. Although not shown, the leads may fan-out from the ILB's to the OLB bondsites which are essentially aligned in a row parallel to the chip edge. It should be noted that the lead design depends on the number of ILB's. In some designs in which a limited number of leads are present, the leads may not need to fan-out.

Figure 26:
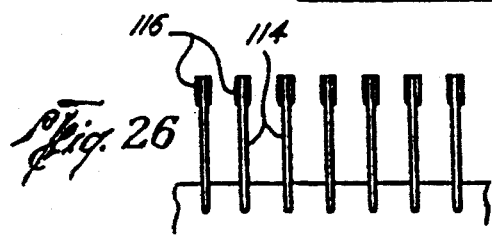
FIG. 26 is a schematic representation of OLB's positioned according to a peripheral bonding scheme.
Figure 27:
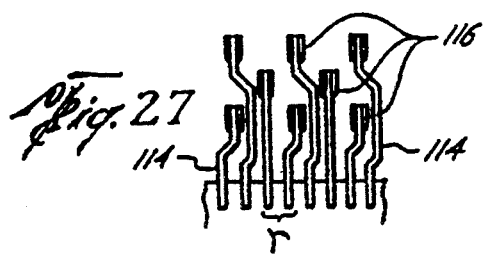
FIG. 27 is a schematic representation of OLB's positioned according to an area bonding scheme.

FIGS. 26 and 27 schematically represent peripheral and area bonding, respectively. The outer leads 114 comprise bondsites 116. The peripheral bonding of FIG. 26 parallels that used in FIG. 25. FIG. 27 illustrates how the OLB's can be arranged in rows in a manner which spaces the center-to-center distances between bondsites to an optimal distance (r).

Figure 28:
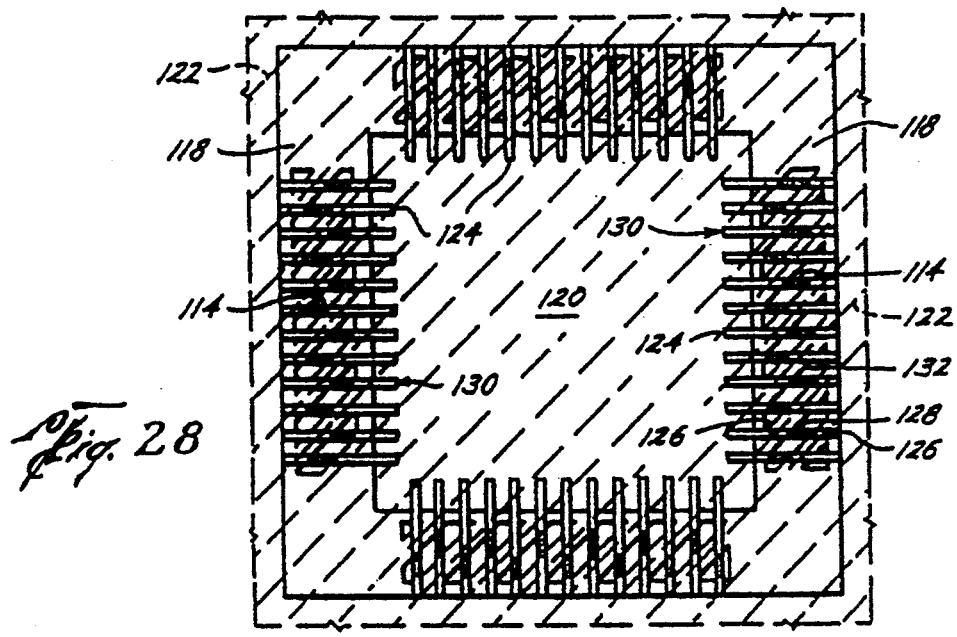
FIG. 28 is an enlarged plan view of a chip lead design.

FIG. 28 further illustrates the inner leads and the lead design according to the present invention. The leads 130 are shown extending from a TAB chip. The chip itself is not shown, but would be positioned, as previously described, in the center of the structure. Starting from the center and working outwardly along the leads, a lightened lead area 124 is shown along the inner edge of the rectangular rim 118. This portion of the leads is the inner lead bonding area which attaches to the chip. The rectangular rim 118, in fact, represents the polyimide tape. As previously described, the polyimide tape is removed in the area where the chip is to be located. Typically, the area where the tape is removed is larger in size than the chip itself leaving a gap between the chip and tape across which the inner leads 124 extend. The cross-hatched area 120 represents the underlying interconnect. The diagonal lines 122 schematically represent the diagonally-extending programming tracks or interconnect regions at which the signal scheme is selected.

Continuing outwardly from the inner leads 124 and onto the tape section 118, the leads are depicted by alternating dark sections 126 bounding a lighter shaded area 128. As shown, the areas 128 of successive leads are staggered along a center-line axis which parallels the diagonal programming tracks 122 and places the areas 128 between the programming tracks. The areas 128 represent the OLB's for bonding the leads to the underlying substrates. As designed, the bondsites do not overlap or interfere with the programming tracks 122.

In order to form the bond between the leads 130 and interconnect 120, it is necessary to form a staggered window between the leads and interconnect at the staggered bonding areas 128. A preferred approach is to form the window in the polyimide tape by removing the tape from the underneath side of the leads along the staggered bondsites 128 of FIG. 28. For example, parallelogram-shaped "boxes" 132 could be formed as shown. Alternatively, the tape could be removed only in the area of the bonds 128. Another option is to form a solder mask over the interconnect 120 in which the mask is designed to correspond to the bondsites 128.

Figure 29:
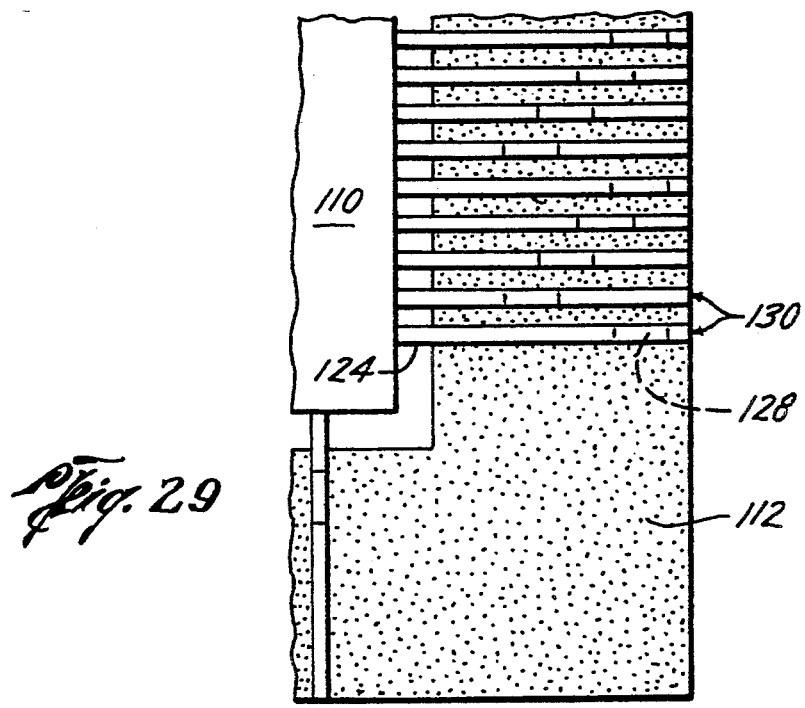
FIG. 29 is an enlarged sectional plan view of a chip lead design.

FIG. 29 is an enlarged representation of a section of leads 130 of the lead design of FIG. 28. The leads, as previously discussed, comprise inner lead bond sections 124 which form ILB's with the chip 110, and OLB's 128 which are staggered in adjacent leads. The outer lead bondsites 128 have not been cross-hatched though they are sections along a continuous lead. The absence of cross-hatching allows for further representing that the tape 112 has been removed at each bondsite 128. FIG. 29 also illustrates that the staggered positioning of the bondsites 128 increases the center-to-center distance of adjacent bondsites. The increased distance allows for improved operation. For example, because the bondsites are farther apart, there is less opportunity for a solder bump of one outer lead bondsite to bleed over to the adjacent site and short circuit the leads. Also, the present staggered OLB design decreases chip footprint size, while still maximizing center-to-center distance to the extent possible. The design also positions a number of outer lead bondsites between adjacent programming tracks of the underlying interconnects.

Figure 30:
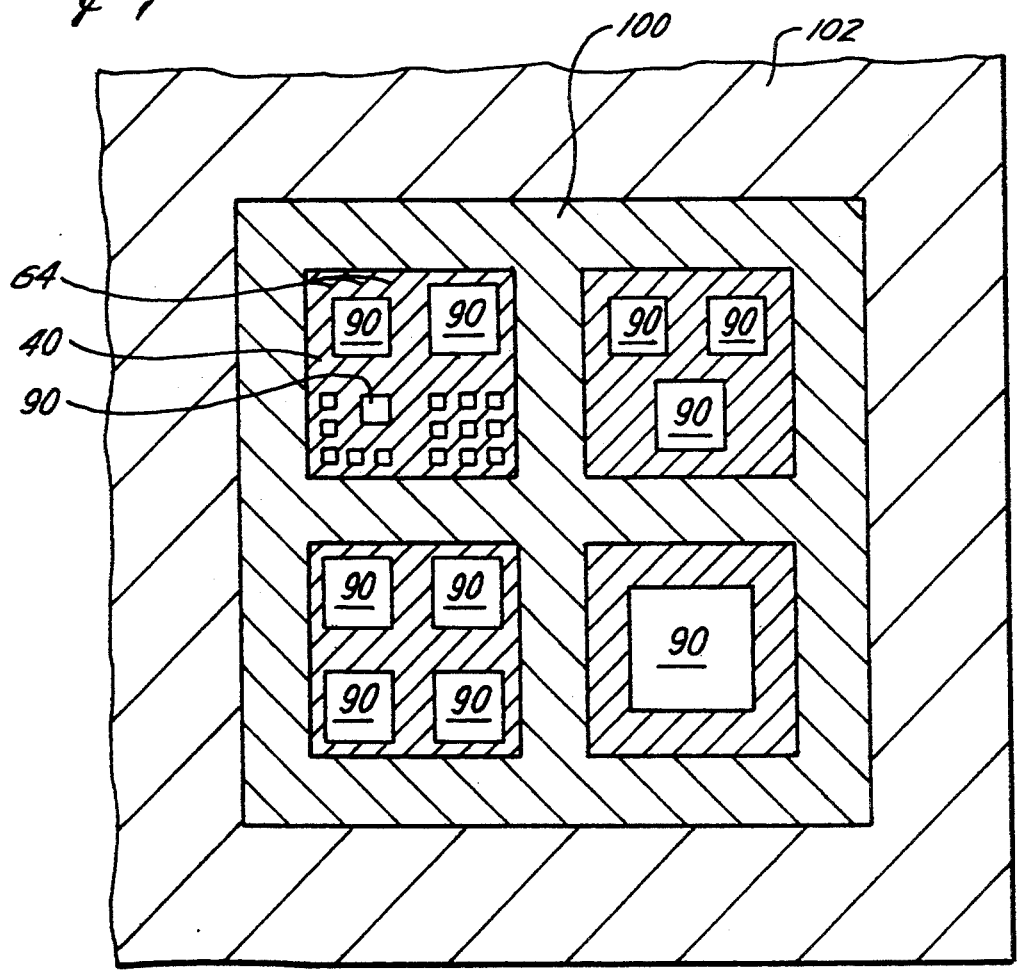
FIG. 30 is a plan view of multiply overlaid and interconnected interconnects according to the present invention and having chips attached thereto.

FIG. 30 illustrates the interconnects 40 with the diagonally-extending programming tracks 64 and a plurality of different-sized chips 90 attached thereto. The figure also illustrates that interconnects having differing pitches of diagonal programming tracks can be interconnected. For example, top interconnect 40 is attached to middle interconnect 100 which in turn is attached to lower interconnect 102. This figure is used to show the applicability of the invention to numerous levels or layers of an overall package scheme.

Figure 31:
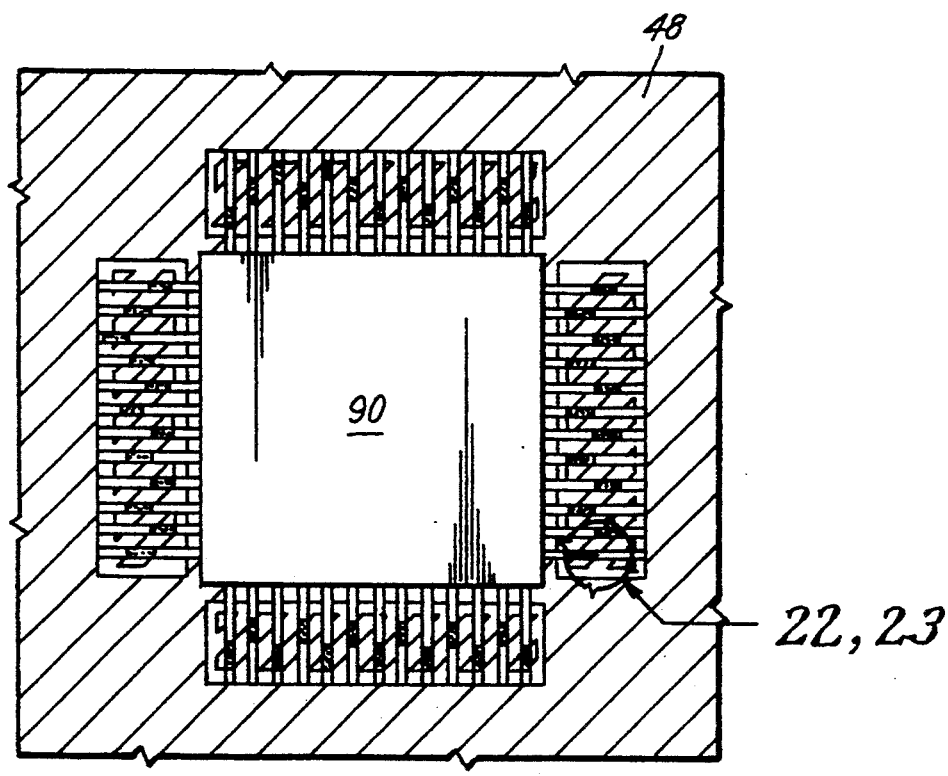
FIG. 31 is a plan view of an interconnect according to the present invention having a chip bonded thereto.

FIG. 31 is a plan view of the chip 90 bonded to the interconnect 48 through the access areas 64. The figure illustrates the use of square Kapton supports which are employed with staggered OLB pads which align to diagonal spaces between the diagonal access areas.

Additionally, though not shown by the figures, the customization layer can also support overflow wiring, engineering changes (EC), test pads and defective line rerouting. Also, to improve electrical performance of the multiple vias present in the interconnect, ground vias can be added in the spare space of the customization layer. The vias serve to lower inductance, realign characteristic impedance and reduce coupling. Also, the vias from the ground and power planes extend to the customization plane, preferably in the areas of the bonding pads. The customization layer between the programming tracks 65 serves as a high frequency shield to reduce coupling and impedance imbalance between X- and Y-layers.

It is also envisioned that the customization plane can support wiring connecting programmable junctions. In other words, the present interconnect provides for a limited amount of design-specific wiring on the customization layer. For example, referring to FIG. 2, a wire could extend on the customization plane from a programmable junction at one point along the programming track to a programmable junction at another point along the programming track.

The final step in the interconnect production is the customization of the undedicated interconnect. Customization embodies, chip connections and the links between the underlying wiring. More specifically, customization refers to the process by which the standard interconnect is customized for a specific end use. The wiring schemes to be established include (1) the underlying wire circuitry, (2) the bonding pads to the select wiring ends, (3) the ground or power vias and (4) any test pads or overflow wiring. The customization can be achieved through a single processing step, thus avoiding multiple patterning steps which are expensive. The single processing step can include single pattern lithographic techniques and laser-assisted techniques, for example, either direct or indirect write. The process can be subtractive or additive. In other words, the links can be selectively applied to achieve the desired interconnect pattern, i.e., additive, or lines can be applied universally throughout the interconnect and then removed, for example, by laser-etching, to achieve the desired end product, i.e., subtractive.

The customization can be done quickly, for example, on the order of a few hours or less. This is a marked improvement over the presently available interconnects, some of which require days or months to develop. The customization can be performed by the end user, with the undedicated interconnect structure being mass produced.

Figure 32:
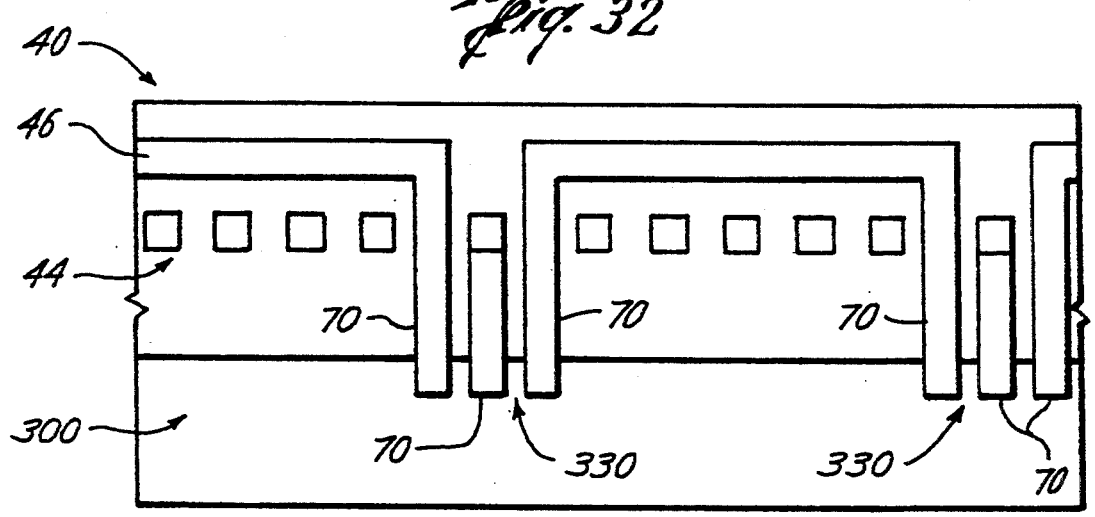
FIG. 32 is a cross-sectional view of programming junctions arranged for electrical programming.

The interconnect layout and principles of the present invention are also applicable to electrically programmable interconnects. For example, the X- and Y-axis wire segments may extend via pillars to a programming layer where programming electrically occurs instead of extending the wires to a customization plane where links mechanically are placed in order to accomplish programming. FIG. 32 illustrates one type interconnect structure, according to the present invention, utilizing electrical programming. Wires segments 44 and 46 extend via pillars 70 to a electrical programming layer 300 in order to form electrical programming junctions 330. Electrical programming layer 300 may exist internally within interconnect 40 as shown in FIG. 32. Electrical programming layer 200, however, is not limited to being an internal layer and may be a surface layer.

Figure 33:
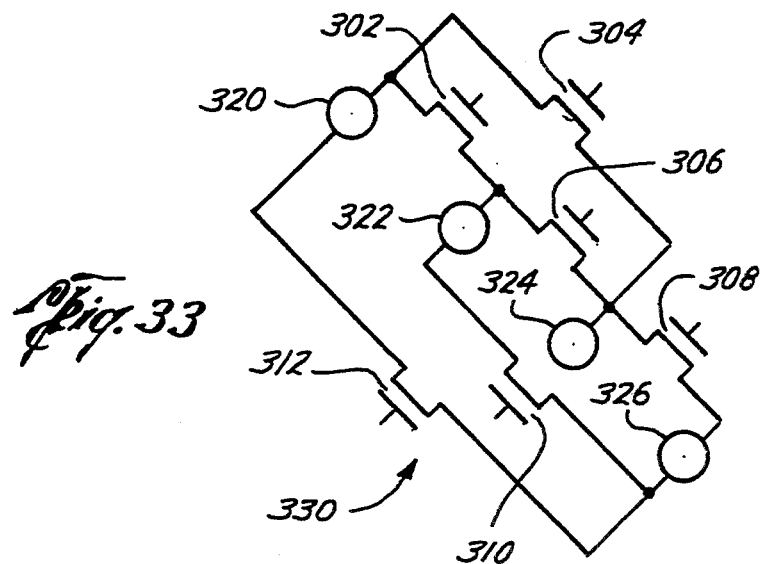
FIG. 33 is a schematic view of an electrically programmable programming junction utilizing pass transistors.

Within electrical programming layer 300, methods known to those skilled in the art may be used to electrically programmably connect the X- and Y-wire segments in the desired configuration. For example, FIG. 33 illustrates the use of pass transistors. FIG. 33 shows the terminal ends of pillars 70 that terminate in electrical programming layer 300 to form an electrical programming junction 330. For convenience, X-wire segment ends are numbered 320 and 322 and the Y-wire segment ends are numbered 324 and 326. Pass transistors 302, 304, 306, 308, 310, and 312 are programmable elements that can selectively connect wire segment ends 320, 322, 324 and 326.

When a pass transistor is "on" an electrically conductive path exists between the wire segment ends that are connected by the particular transistor. Thus, in order to connect X-wire segment ends 322 and 320, pass transistor 302 must be turned on. In order to connect X-wire segment end 322 and Y-wire segment end 326, pass transistor 310 must be turned on. Similarly, all possible connections of the wire segment ends within electrical programming junction 330 may be electrically connected by selectively turning on pass transistors.

FIG. 33 is illustrative of one method of electrical programming that may be utilized in the interconnect of the present invention. Other methods of electrical programming using different programmable elements that are known in the art may be used in accordance with this invention to program the programming junction. Such alternative programmable elements include, but are not limited to, dielectric breakdown structures antifuses, silicon crystallization structures, diodes and fuses. Addressing methods known in the art could be used with these alternative electrical programmable elements.

Figure 34:
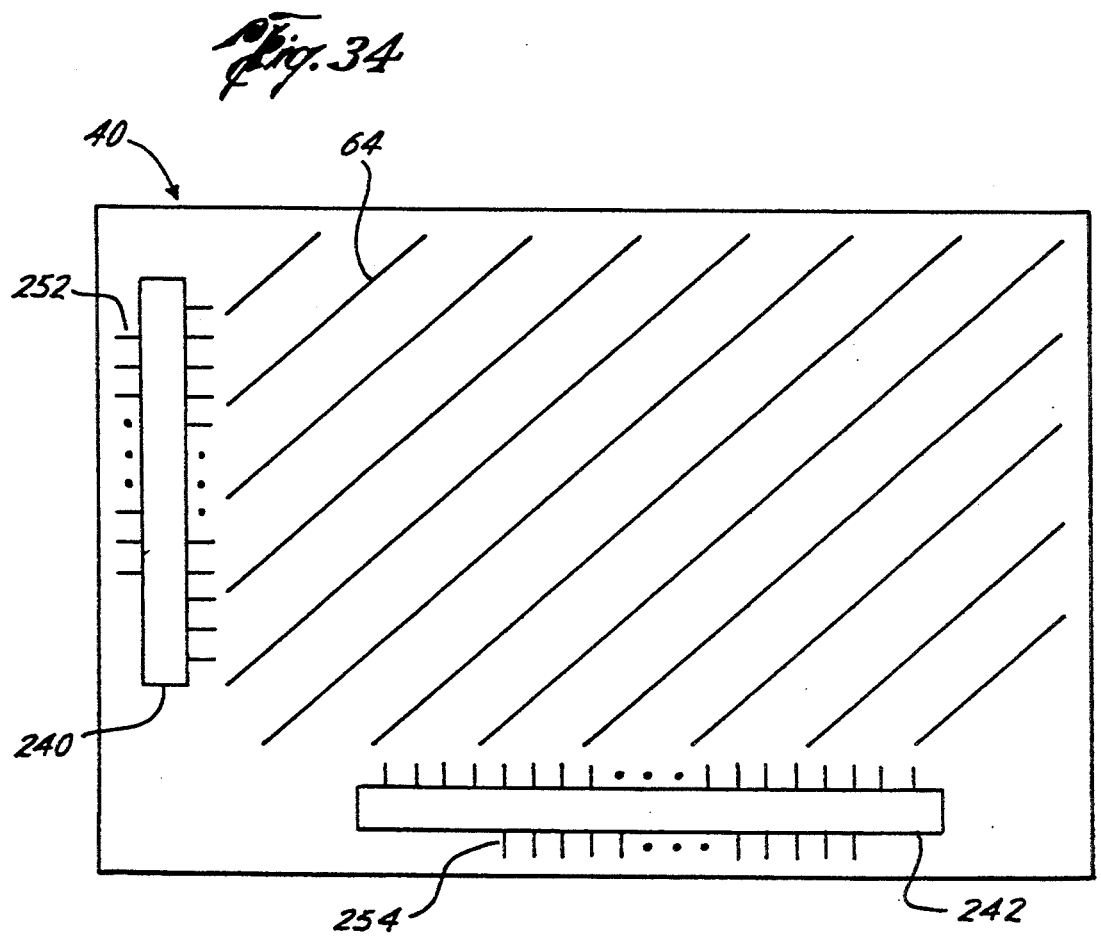
FIG. 34 is a plan view of an electrically programmable interconnect according to the present invention.

A top view of interconnect 40 utilizing electrically programmable junctions is shown in FIG. 34. Programming tracks 64 are shown, however, it is recognized that these tracks may actually be internally within interconnect 40 in electrical programming layer 300 as shown in FIG. 32.

FIG. 34 further illustrates a method that may be used to selectively turn a specific pass transistor on or off. Each pass transistor is specifically addressable by the user, as known in the art, through X-decoder electrical circuit 240 and Y-decoder electrical circuit 242. X-address inputs 252 and Y-address inputs 254 are delivered to the respective decoders by the user through input/output pins (not shown) or other means known in the art. The decoder circuits may then generate the appropriate electrical signals to turn a specific pass transistor on or off. Alternative methods to address specific transistors are well known in the art. The method described above is shown for illustrative purposes. The present invention is not meant to be limited to the method described and shown, but rather, could be used with a variety of addressing methods known in the art.

The interconnect of the present invention can be produced by a variety of methods. The manufacturing method described below is used to form an interconnect having a reference layer below the lower layer of conducting wires, two layers of conducting wires and a top customization layer. As will become apparent from the discussion below, the various steps can be excluded or repeated to produce the specific interconnect designs previously discussed. In accordance with the present method, a supporting interconnect, such as ceramic or other material, is selected to receive the conducting layers of the interconnect. The support may be rigid or flexible. A conductive material is then deposited on the interconnect to form a lower reference plane for the conductive wires. The conductive material can be deposited by sputtering, electroless plating, electroplating or lamination. Optionally, a dielectric layer may be formed between the supporting interconnect and the lower reference plane. An additional dielectric layer is placed on top of the lower reference layer to separate this layer from the interconnect layers which follow.

The lower layer of conductive wires is formed by etching of a blanket layer of metal which is applied in the same manner as the lower reference layer. Alternatively, a lift-off technique or plating method may be used to form the conductors. Vias are required to connect the lower layer of conductive wires or the underlying reference or voltage planes to the top surface where customization occurs. A stacked via approach is preferred such that the area of via cluster is minimized, and thus line density is maximized. Formation of the stacked via may be achieved through anisotropic etch, or for filled vias by electroless plating or electroplating. For the latter method, a plating interconnect is necessary at the layer preceding the via level.

A further dielectric layer is used to separate the lower conductive layer from the upper conductive layer. This dielectric may be spun on top of the existing layer in liquid form and cured to a hardened state. If electroplating is used to form the stacked via, this dielectric must flow around the plated-up via structure. In order to create a planar surface for additional layers, it is convenient to planarize the cured dielectric layer through which the vias protrude. This can be accomplished by several well-known planarization techniques, including etchback and mechanical polishing.

The second layer of conductive wires is formed in a manner identical to that for forming the first layer of conductive wires, with the appropriate vias from the underlaying layers connecting to the second conductor layer. The preceding steps for forming the vias, dielectric and planarization are repeated to continue the migration of the upper and lower (X and Y) wire segments ends up to the topmost surface where customization occurs. A top reference layer is formed according to the same process as used for forming the other reference planes. This top reference plane may be a final layer, or alternatively, the above steps may be appropriately repeated to bring the wire segment ends to a layer above the top reference plane.

As can be understood form the above discussion, these various techniques can be repeated or modified to produce a variety of specific interconnect structures, depending on user needs.

As a result of the present design, the resulting interconnect is scalable to whatever technology with which it is to be used. Less dense interconnects are used in printed circuit applications and more dense interconnects are used in integrated circuit applications. This results form the fact that the construction of the interconnect utilizes the construction of the technology. Only the design remains constant. Thus, as circuitry construction becomes more sophisticated, the interconnect construction will keep pace.

In addition to the advantages of the present structure discussed above, the consistent interconnect pattern of the present invention provides for ease in testing the wiring and makes for predictable discontinuity effects. The interconnect also allows for similar crossover loading for all lines, as well as for good plating characteristics. Also, the lines provide for high-speed signal transport with controlled impedance. The ground vias can be mixed with personality vias to reduce via discontinuity.

The design also provides inherent fault-tolerance by allowing route-around of non-functional line segments.

A test and repair strategy can be employed at each step of the interconnect processing, allowing potential yields of finished product to be quite high.

The regularity of the interconnect design may also allow "tiling" of good interconnect sections to achieve larger interconnects. The interconnect can be used as a first level packaging or can be extended to generic interconnect vehicles at higher levels of packaging, e.g., as an interconnect for modules and printed circuit boards.

The primary application of the present interconnects is to provide high performance multi-chip customizable circuitry. The high cost typically associated with such interconnects is lowered dramatically by the present universal interconnect. By avoiding the use of fully custom wiring, volume and yield are increased and the end user is thus responsible for only a small fraction of the overall fabrication. By taking advantage of a compatible chip bonding design, density and flexibility of the resulting customizable circuitry is greatly enhanced.

The present invention, therefore, is well adapted to carry out the objects and obtain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A programmable electrical interconnect for connecting electrical components comprising:
   a set of X-conductors comprising a plurality of substantially parallel electrically conductive segments of substantially uniform length arranged end-to-end;
   a set of Y-conductors comprising a plurality of substantially parallel electrically conductive segments of substantially uniform length arranged end-to-end; and
   a plurality of programmable junctions formed in a regular pattern, each programmable junction comprising segment ends of two X-conductor segments, and segment ends of two Y-conductor segments, the segment ends in each programmable junction being positioned whereby selective electrical connection can be accomplished between all combinations of segment ends forming the programmable junction, thereby permitting selective X to X, Y to Y, and X to Y connection between the segment ends forming each programmable junction, as well as combinations of X to X, Y to Y, and X to Y connections.

2. The interconnect of claim 1, wherein the X-conductor set and Y-conductor set being positioned whereby the segments of the X-conductor cross segments of the Y-conductors.

3. The interconnect of claim 2, further comprising an interconnect layer including said programmable junctions, a majority of the X-segment and Y-segments extending to said interconnect layer to form the programmable junctions.

4. The interconnect of claim 3, wherein the X-conductor segments being formed in first and second conductor layers, and wherein the Y-conductor segments being formed in the first and second conductor layers.

5. The interconnect of claim 3, wherein:
   each of said two X-conductor segments terminating at each programmable junction being formed in separate layers, a first conductor layer and a second conductor layer; and wherein
   each of said two Y-conductor segments terminating at each programmable junction being formed in separate layers, the first conductor layer and the second conductor layer.

6. The interconnect of claim 3, wherein:
   end-to-end adjacent X-conductor segments alternate between a first conductor layer and a second conductor layer, the first and second conductor layers lying in separate planes; and wherein
   end-to-end adjacent Y-conductor segments alternate between the first conductor layer and the second conductor layer.

7. The interconnect of claim 1, further comprising:
   a resistive link, capable of accomplishing the selective X to X, Y to Y, and X to Y connections, selectively connected to at least one segment end, the link having a resistance sufficient to significantly reduce signal reflection of electrical signals carried by said interconnect.

8. The interconnect of claim 1, further comprising:
   a plurality of resistive links, capable of accomplishing the selective X to X, Y to Y, and X to Y connections, selectively connecting the segment ends, the links having a combined distributed resistance sufficient to significantly reduce signal reflection of electrical signals carried by said interconnect.

9. The interconnect of claim 1, further comprising:
   a conductive plane substantially parallel to said sets of X- and Y-conductors;
   at least one conductive plane connection within at least one programming junction; and
   at least one resistive link selectively connecting at least one segment end to the conductive plane connection whereby the resistance of the at least one link significantly reduces signal reflection of electrical signals carried by the interconnect.

10. The interconnect of claim 1, wherein said programmable junctions are electrically programmable junctions.

11. The interconnect of claim 10, further comprising an electrical programming layer wherein electrical programming of said programmable junctions can be accomplished.

12. The interconnect of claim 11, further comprising an electrical circuit for addressing said electrically programmable junctions.

* * * * *

UNITED STATES PATENT AND TRADEMARK OFFICE
CERTIFICATE OF CORRECTION

PATENT NO.  :  5,438,166

DATED       :  August 1, 1995

INVENTOR(S) :  David H. Carey and Barry H. Whalen

It is certified that error appears in the above-identified patent and that said Letters Patent is hereby corrected as shown below:

```
In claim 2, column 23, line 55, delete "X-conductor" and insert
--X-conductors-- therefor.
```

Signed and Sealed this

Tenth Day of October, 1995

*Attest:*

BRUCE LEHMAN

*Attesting Officer*   *Commissioner of Patents and Trademarks*